US012649878B2

(12) United States Patent
Sumi et al.

(10) Patent No.: US 12,649,878 B2
(45) **Date of Patent: *Jun. 9, 2026**

(54) POLYMERIZABLE LIQUID CRYSTAL COMPOSITION, OPTICALLY ANISOTROPIC LAYER, OPTICAL FILM, POLARIZING PLATE, AND IMAGE DISPLAY DEVICE

(71) Applicant: FUJIFILM Corporation, Tokyo (JP)

(72) Inventors: Toshikazu Sumi, Kanagawa (JP); Tatsuya Iwasaki, Kanagawa (JP); Shunya Katoh, Kanagawa (JP); Hiroshi Inada, Kanagawa (JP); Megumi Okubo, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 5 days.

This patent is subject to a terminal disclaimer.

(21) Appl. No.: 17/949,678

(22) Filed: Sep. 21, 2022

(65) Prior Publication Data

US 2023/0042986 A1 Feb. 9, 2023

Related U.S. Application Data

(63) Continuation of application No. PCT/JP2021/011724, filed on Mar. 22, 2021.

(30) Foreign Application Priority Data

Mar. 27, 2020 (JP) ................................ 2020-057526
Jul. 10, 2020 (JP) ................................ 2020-118912

(51) Int. Cl.

| | |
|---|---|
| ***G02F 1/1333*** | (2006.01) |
| ***C09K 19/34*** | (2006.01) |
| ***C09K 19/38*** | (2006.01) |
| ***C09K 19/56*** | (2006.01) |
| ***G02B 5/30*** | (2006.01) |
| *C09K 19/04* | (2006.01) |
| *H10K 59/80* | (2023.01) |

(52) U.S. Cl.

CPC ...... *C09K 19/3491* (2013.01); *C09K 19/3861* (2013.01); *C09K 19/56* (2013.01); *G02B 5/3016* (2013.01); *C09K 2019/0448* (2013.01); *H10K 59/8791* (2023.02)

(58) Field of Classification Search

CPC ............ C09K 19/3804; C09K 19/3861; C09K 19/56; C09K 19/3491; C09K 19/322; C09K 19/3497; C09K 2019/0448; G02F 1/1333; G02B 5/301

See application file for complete search history.

(56) References Cited

U.S. PATENT DOCUMENTS

| | | | | |
|---|---|---|---|---|
| 5,851,427 A * | 12/1998 | Kelly | C09K 19/408 544/298 |
| 2015/0079380 A1 | 3/2015 | Muramatsu et al. | |
| 2020/0140759 A1 | 5/2020 | Shimamura et al. | |
| 2020/0319507 A1 | 10/2020 | Matsuyama et al. | |
| 2022/0267675 A1 * | 8/2022 | Sumi | C08F 220/20 |
| 2023/0042986 A1 * | 2/2023 | Sumi | H10K 50/00 |

FOREIGN PATENT DOCUMENTS

| | | | | |
|---|---|---|---|---|
| JP | 08-245520 A | | 9/1996 | |
| JP | 2001-133785 A | | 5/2001 | |
| JP | 2002-180051 A | | 6/2002 | |
| JP | 2007-79337 | * | 3/2007 | G02F 1/13363 |
| JP | 2007-079337 A | | 3/2007 | |
| JP | 2009-274984 A | | 11/2009 | |
| JP | 2011-084477 A | | 4/2011 | |
| JP | 2015-200861 A | | 11/2015 | |
| JP | 2018-162379 | * | 10/2018 | C09K 19/54 |
| JP | 2018-162379 A | | 10/2018 | |
| WO | 2019/017445 A1 | | 1/2019 | |
| WO | 2019/132020 A1 | | 7/2019 | |

OTHER PUBLICATIONS

Office Action, issued by the Japanese Patent Office on Oct. 31, 2023, in connection with Japanese Patent Application No. 2022-510486.

International Search Report issued in PCT/JP2021/011724 on Jun. 1, 2021.

Written Opinion issued in PCT/JP2021/011724 on Jun. 1, 2021.

International Preliminary Report on Patentability completed by WIPO on Sep. 22, 2022 in connection with International Patent Application No. PCT/JP2021/011724.

Office Action, issued by the Japanese Patent Office on Apr. 2, 2024, in connection with Japanese Patent Application No. 2022-510486.

Office Action, issued by the State Intellectual Property Office of China on Mar. 31, 2025, in connection with Chinese Patent Application No. 202180024887.6.

* cited by examiner

*Primary Examiner* — Geraldina Visconti

(74) *Attorney, Agent, or Firm* — Edwards Neils LLC; Jean C. Edwards, Esq.

(57) ABSTRACT

Provided is a polymerizable liquid crystal composition capable of suppressing the generation of precipitates; and an optically anisotropic layer, an optical film, a polarizing plate, and an image display device. The polymerizable liquid crystal composition contains a forward wavelength dispersion liquid crystal compound A having an aromatic ring having 10 or more π electrons and a forward wavelength dispersion liquid crystal compound B having an aromatic ring having 6 or more and less than 10 π electrons.

16 Claims, 1 Drawing Sheet

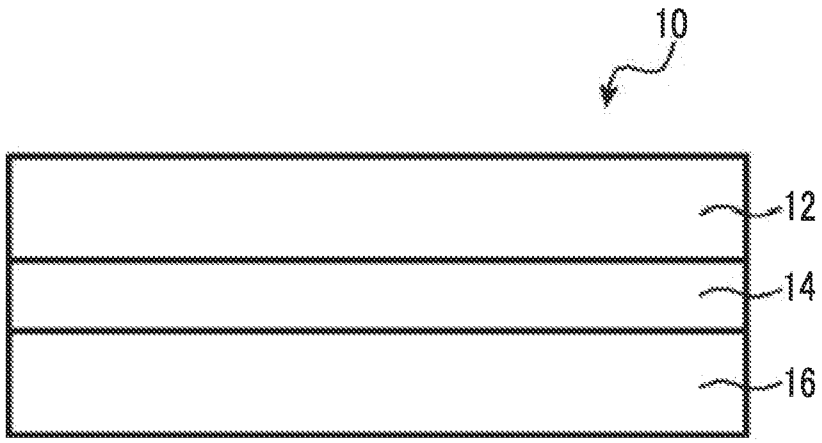
10
12
14
16

POLYMERIZABLE LIQUID CRYSTAL COMPOSITION, OPTICALLY ANISOTROPIC LAYER, OPTICAL FILM, POLARIZING PLATE, AND IMAGE DISPLAY DEVICE

CROSS-REFERENCE TO RELATED APPLICATIONS

This application is a Continuation of PCT International Application No. PCT/JP2021/011724 filed on Mar. 22, 2021, which was published under PCT Article 21 (2) in Japanese, and which claims priority under 35 U.S.C. § 119 (a) to Japanese Patent Application No. 2020-057526 filed on Mar. 27, 2020 and Japanese Patent Application No. 2020-118912 filed on Jul. 10, 2020. The above applications are hereby expressly incorporated by reference, in their entirety, into the present application.

BACKGROUND OF THE INVENTION

1. Field of the Invention

The present invention relates to a polymerizable liquid crystal composition, an optically anisotropic layer, an optical film, a polarizing plate, and an image display device.

2. Description of the Related Art

Optical films such as an optical compensation sheet and a phase difference film are used in various image display devices in order to eliminate image coloration or expand a view angle.

A stretched birefringent film has been used as the optical film, but in recent years, it has been proposed to use an optical film having an optically anisotropic layer consisting of a liquid crystal compound instead of the stretched birefringent film.

As such an optically anisotropic layer, for example, an optically anisotropic layer in which a polymerizable composition including one or more polymerizable rod-like liquid crystal compounds exhibiting a smectic phase is immobilized in a state of exhibiting a smectic phase is described in JP2015-200861A ([Claim 1]).

SUMMARY OF THE INVENTION

The present inventors have conducted studies on the polymerizable composition described in JP2015-200861A, and have thus found that precipitates may be generated upon application and there is room for improvement in terms of suitability for forming a long optically anisotropic layer (length suitability).

Therefore, an object of the present invention is to provide a polymerizable liquid crystal composition capable of suppressing the generation of precipitates; and an optically anisotropic layer, an optical film, a polarizing plate, and an image display device.

The present inventors have conducted intensive studies to accomplish the object, and as a result, they have found that generation of precipitates can be suppressed by using a polymerizable liquid crystal composition containing a forward wavelength dispersion liquid crystal compound having an aromatic ring having 10 or more π electrons, and a forward wavelength dispersion liquid crystal compound having an aromatic ring having 6 or more and less than 10 π electrons, thereby completing the present invention.

That is, the present inventors have found that the object can be accomplished by the following configurations.

[1] A polymerizable liquid crystal composition comprising:

a forward wavelength dispersion liquid crystal compound A having an aromatic ring having 10 or more π electrons; and a forward wavelength dispersion liquid crystal compound B having an aromatic ring having 6 or more and less than 10 π electrons.

[2] The polymerizable liquid crystal composition as described in [1], in which the forward wavelength dispersion liquid crystal compound A is a compound having polymerizable groups $P^{11}$ and $P^{12}$ constituting one terminal and the other terminal of the forward wavelength dispersion liquid crystal compound A, respectively, and three or more rings $B^{11}$ selected from the group consisting of an aromatic ring which may have a substituent and an alicyclic ring which may have a substituent, and existing on a bond that links the polymerizable groups $P^{11}$ and $P^{12}$, and the forward wavelength dispersion liquid crystal compound B is a compound having polymerizable groups $P^{21}$ and $P^{22}$ constituting one terminal and the other terminal of the forward wavelength dispersion liquid crystal compound B, respectively, and three or more rings $B^{21}$ selected from the group consisting of an aromatic ring which may have a substituent and an alicyclic ring which may have a substituent, and existing on a bond that links the polymerizable groups $P^{21}$ and $P^{22}$, where one terminal and the other terminal of a compound mean a starting atom and an ending atom, respectively, tor which a maximum number of atoms is calculated in a case where the atoms on a bond of the compound are linked at the shortest distance.

[3] The polymerizable liquid crystal composition as described in [2], in which an array of the rings $B^{11}$ arranged in order from the polymerizable group $P^{11}$ or $P^{12}$ in the forward wavelength dispersion liquid crystal compound A is the same as an array of the rings $B^{21}$ arranged in order from the polymerizable group $P^{21}$ or $P^{22}$ in the forward wavelength dispersion liquid crystal compound B, provided that in a case where all of objects to be compared are aromatic rings with regard to the array of the rings, it is considered that the rings constitute the same array even though the rings have different ring structures or substituents; and in a case where all of objects to be compared are alicyclic rings, it is considered that the rings constitute the same array even though the rings have different ring structures or substituents, and the array of the rings is construed not to include a structure of a linking portion between two rings.

[4] The polymerizable liquid crystal composition as described in any one of [1] to [3], in which the forward wavelength dispersion liquid crystal compound A is a compound represented by Formula (I) which will be described later, and the forward wavelength dispersion liquid crystal compound B is a compound represented by Formula (II) which will be described later.

[5] The polymerizable liquid crystal composition as described in [4], in which in Formula (I) which wilt be described later, m11 is 2, $X^{12}$ existing between two $Cy^{11}$'s is a single bond, m12 is 2, and $X^{15}$ existing between two $Cy^{12}$'s is a single bond, and in Formula (II) which will be described later, m21 is 2, $X^{22}$ existing between two $Cy^{21}$'s is a single bond, m22 is 2, and $X^{25}$ existing between two $Cy^{22}$'s is a single bond.

[6] The polymerizable liquid crystal composition as described in [4] or [5], in which a structure other than $Ar^{13}$ in Formula (I) which will be described later and a structure other than $Ar^{23}$ in Formula (II) which will be described later are the same structures.

[7] The polymerizable liquid crystal composition as described in any one of [4] to [6], in which in Formula (I) which will be described later, a total of n11, m11, k11, m12, and n12 is an integer of 5 to 10, and in Formula (II) which will be described later, a total of n21, m21, k21, m22, and n22 is an integer of 5 to 10.

[8] The polymerizable liquid crystal composition as described in any one of [4] to [7], in which $Ar^{13}$ in Formula (I) which will be described later and $Ar^{23}$ in Formula (II) which will be described later are both aromatic hydrocarbon rings which may have a substituent.

[9] The polymerizable liquid crystal composition as described in any one of [4] to [8], in which $Ar^{13}$ in Formula (I) which will be described later is an aromatic ring represented by Formula (III) which will be described later.

[10] The polymerizable liquid crystal composition as described in any one of [1] to [9], further comprising a reverse wavelength dispersion liquid crystal compound having any aromatic ring selected from the group consisting of groups represented by Formulae (Ar-1) to (Ar-7) which will be described later,

[11] An optically anisotropic layer obtained by immobilizing an alignment state of the polymerizable liquid crystal composition as described in any one of [1] to [10].

[12] The optically anisotropic layer as described in [11], in which the optically anisotropic layer shows a diffraction peak derived from a periodic structure in X-ray diffraction measurement.

[13] The optically anisotropic layer as described in [11] or [12], in which the forward wavelength dispersion liquid crystal compound A and the forward wavelength dispersion liquid crystal compound B included in the polymerizable liquid crystal composition are immobilized in a state of being horizontal alignment with respect to a main surface of the optically anisotropic layer.

[14] The optically anisotropic layer as described in any one of [11] to [13], in which the optically anisotropic layer is a positive A-plate.

[15] An optical film comprising the optically anisotropic layer as described in any one of [11] to [14].

[16] The optical film as described in [15], in which the optically anisotropic layer is formed on a surface of a photo-alignment film.

[17] A polarizing plate comprising:

the optical film as described in [15] or [16]; and a polarizer.

[18] An image display device comprising the optical film as described in [15] or [16], or the polarizing plate as described in [17].

[19] The imago display device as described in [18], in which the image display device is a liquid crystal display device.

[20] The image display device as described in [18], in which the image display device is an organic EL display device.

According to the present invention, it is possible to provide a polymerizable liquid crystal composition capable of suppressing the generation of precipitates; and an optically anisotropic layer, an optical film, a polarizing plate, and an image display device

BRIEF DESCRIPTION OF THE DRAWINGS

FIG. 1 is a schematic cross-sectional view showing an example of an optical film.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

Furthermore, in the present specification, a numerical value range expressed using "to" means a range that includes the preceding and succeeding numerical values of "to" as the lower limit value and the upper limit value, respectively.

In addition, in the present specification, only one kind of the substance corresponding to each component may be used alone or two or more kinds thereof may also be used in combination, for each component. Here, in a case where the two or more kinds of substances are used in combination for each component, the content of the component refers to a total content of the substances used in combination unless otherwise specified.

In addition, in the present specification, the bonding direction of a divalent group (for example, —CO—O—) as noted is not particularly limited unless the bonding position is specified, and for example, in a case where $X^{11}$ in Formula (I) which will be described later is —CO—O—, $X^{11}$ may be either *1-CO—O—*2 or *1-O—CO—*2, in which *1 represents a bonding position to the $Sp^{11}$ side and *2 represents a bonding position to the $Ar^{11}$ side.

[Polymerizable Liquid Crystal Composition]

The polymerizable liquid crystal composition of an embodiment of the present invention is a polymerizable liquid crystal composition containing a forward wavelength dispersion liquid crystal compound A having an aromatic ring having 10 or more π electrons and a forward wavelength dispersion liquid crystal compound B having an aromatic ring having 6 or more and less than 10 π electrons.

In the present invention, as described above, the generation of precipitates can be suppressed by using a polymerizable liquid crystal composition containing a forward wavelength dispersion liquid crystal compound A having an aromatic ring having 10 or more π electrons, and a forward wavelength dispersion liquid crystal compound B having an aromatic ring having 6 or more and less than 10 π electrons.

A reason therefor is not specifically clear, but is presumed to be as follows by the present inventors.

First, the present inventors have presumed that the interaction between the liquid crystal compounds is stronger due to a interaction (stacking interaction) by blending the forward wavelength dispersion liquid crystal compound A having an aromatic ring having 10 or more π electrons.

In addition, the present inventors have presumed that the aggregation of the forward wavelength dispersion liquid crystal compound A alone, having the stronger interaction, can be suppressed by further blending the forward wavelength dispersion liquid crystal compound B having an aromatic ring having 6 or more and less than 10 π electrons together with the forward wavelength dispersion liquid crystal compound A.

Therefore, in the present invention, it is considered that since it was possible to enhance the interaction between the liquid crystal compounds while suppressing the aggregation by blending the forward wavelength dispersion liquid crystal compound A and the forward wavelength dispersion liquid crystal compound B, the generation of precipitates could be suppressed.

Hereinafter, the respective components of the polymerizable liquid crystal composition of the embodiment of the present invention will be described in detail.

[Forward Wavelength Dispersion Liquid Crystal Compound A]

The forward wavelength dispersion liquid crystal compound A contained in the polymerizable liquid crystal composition of the embodiment of the present invention is a forward wavelength dispersion liquid crystal compound having an aromatic ring having 10 or more π electrons.

Here, the expression, the "forward wavelength dispersion" liquid crystal compound in the present specification means that in a case where an in-plane retardation (Re) value at a specific wavelength (visible light range) of a phase difference film manufactured using the compound is measured, the Re value is decreased as a measurement wavelength is increased.

In the present invention, from the viewpoint of improving the aligning properties, the forward wavelength dispersion liquid crystal compound A is preferably a compound having polymerizable groups $P^{11}$ and $P^{12}$ constituting one terminal and the other terminal of the forward wavelength dispersion liquid crystal compound A, respectively, and three or more rings $B^{11}$ selected from the group consisting of an aromatic ring which may have a substituent and an alicyclic ring which may have a substituent, and existing on a bond that links the polymerizable groups $P^{11}$ and $P^{12}$.

Here, the one terminal and the other terminal of the compound mean a starting atom and an ending atom, respectively, for which a maximum number of atoms is calculated in a case where the atoms on the bond of the compound are linked at the shortest distance.

In addition, the expression, the ring $B^{11}$ "existing on a bond that links the polymerizable groups $P^{11}$ and $P^{12}$", means that the ring $B^{11}$ constitutes a part of a portion necessary for directly linking the polymerizable groups $P^{11}$ and $P^{12}$. Furthermore, the forward wavelength dispersion liquid crystal compound A may have a portion other than the portion necessary for directly linking the polymerizable groups $P^{11}$ and $P^{12}$ (hereinafter also simply referred to as a "side chain"), but it is construed that the ring structure constituting a part of the side chain is not included in the ring $B^{11}$.

In addition, the two polymerizable groups $P^{11}$ and $P^{12}$ of the forward wavelength dispersion liquid crystal compound A may be the same as or different from each other, and the three or more rings $B^{11}$ contained in the forward wavelength dispersion liquid crystal compound A may be the same as or different from each other.

The polymerizable groups $P^{11}$ and $P^{12}$ are not particularly limited, hut are each preferably a polymerizable group which is radically polymerizable or canonically polymerizable.

A known radically polymerizable group can be used as the radically polymerizable group, and suitable examples thereof include an acryloyloxy group or a methacryloyloxy group. In this case, it is known that the acryloyloxy group generally has a high polymerization rate, and from the viewpoint of improvement of productivity, the acryloyloxy group is preferable but the methacryloyloxy group can also be used as the polymerizable group.

A known canonically polymerizable group can be used as the canonically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and an epoxy group, an oxetanyl group, or the vinyloxy group is more preferable.

Particularly preferred examples of the polymerizable group include a polymerizable group represented by any of Formulae (P-1) to (P-20).

(P-1)

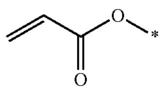

(P-2)

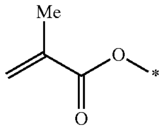

(P-3)

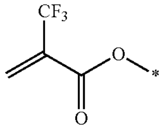

(P-4)

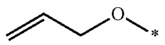

(P-5)

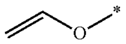

(P-6)

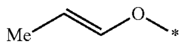

(P-7)

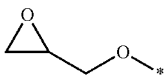

(P-8)

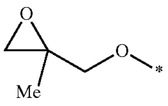

(P-9)

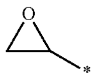

(P-10)

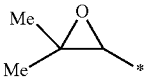

-continued (P-11)

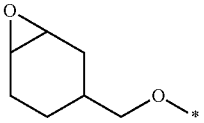

(P-12)

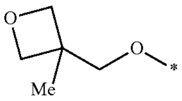

(P-13)

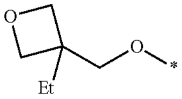

(P-14)

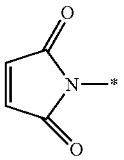

(P-15)

HS—*

(P-16)

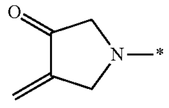

(P-17)

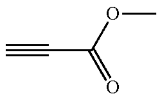

(P-18)

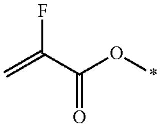

(P-19)

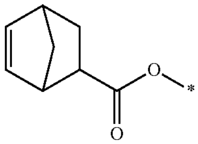

(P-20)

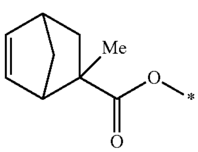

The forward wavelength dispersion liquid crystal compound A may have three or more polymerizable groups. In a case where the polymerizable liquid crystal compound has three or more polymerizable groups, the polymerizable group other than the above-mentioned polymerizable groups $P^{11}$ and $P^{12}$ is not particularly limited, and examples of the polymerizable group, including suitable aspects thereof, include the same ones as those of the polymerizable group which is radically polymerizable or canonically polymerizable.

The number of polymerizable groups contained in the polymerizable liquid crystal compound is preferably 2 to 4, and more preferably only two of the polymerizable groups $P^{11}$ and $P^{12}$ are contained.

Examples of the aromatic ring which may have a substituent, which is one aspect of the ring $B^{11}$, include an aromatic ring having 5 to 20 ring members, which may have a substituent.

Examples of the aromatic ring having 5 to 20 ring members include an aromatic hydrocarbon ring such as a benzene ring, a naphthalene ring, an anthracene ring, and a phenanthrene ring; and an aromatic heterocyclic ring such as a furan ring, a pyrrole ring, a thiophene ring, a pyridine ring, a thiazole ring, a benzothiazole ring, a guillotine ring, an isoquinoline ring, a quinoxaline ring, and a quinazoline ring.

Examples of the substituent which may be contained in the aromatic ring which is one aspect of the ring $B^{11}$ include an alkyl group, an alkoxy group, an alkylcarbonyl group, an alkoxycarbonyl group, an alkylcarbonyloxy group, an alkylamino group, a dialkylamino group, an alkylamide group, an alkenyl group, an alkynyl group, a halogen atom, a cyano group, a nitro group, an alkylthiol group, and an N-alkylcarbamate group.

Among those, the alkyl group, the alkoxy group, the alkoxycarbonyl group, the alkylcarbonyloxy group, or the halogen atom is preferable.

As the alkyl group, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the alkoxycarbonyl group include a group in which an oxycarbonyl group (—O—CO— group) is bonded to the alkyl group exemplified above, and for example, the alkoxycarbonyl group is preferably a methoxycarbonyl group, an ethoxycarbonyl group, an n-propoxycarbonyl group, or an isopropoxycarbonyl group, and more preferably the methoxycarbonyl group.

Examples of the alkylcarbonyloxy group include a group in which a carbonyloxy group (—CO—O— group) is bonded to the alkyl group, and for example, a methylcarbonyloxy group, an ethylcarbonyloxy group, an n-propylcarbonyloxy group, or an isopropylcarbonyloxy group is preferable, and the methylcarbonyloxy group is more preferable.

Examples of the halogen atom include a fluorine atom, a chlorine atom, a bromine atom, and an iodine atom, and the fluorine atom or the chlorine atom is preferable.

Examples of the alicyclic ring which may have a substituent, which is one aspect of the ring $B^{11}$, include a divalent alicyclic hydrocarbon group having 5 to 20 carbon atoms, which may have a substituent, and a heterocyclic ring in which one or more of $—CH_2—$'s constituting, an alicyclic hydrocarbon group having 5 to 20 carbon atoms are substituted with —O—, —S—, or —NH—.

As the divalent alicyclic hydrocarbon group having 5 to 20 carbon atoms, a 5-membered ring or a 6-membered ring is preferable. In addition, the alicyclic hydrocarbon group may be saturated or unsaturated, but is preferably the saturated alicyclic hydrocarbon group. With regard to the divalent alicyclic hydrocarbon group, reference can be made to, for example, the description in paragraph [0078] of JP2012-21068A, the contents of which are hereby incorporated by reference.

As the alicyclic ring which is one aspect of the ring $B^{11}$, a cycloalkane ring having 5 to 20 carbon atoms is preferable. Examples of the cycloalkane ring having 5 to 20 carbon atoms include a cyclohexane ring, a cyclopeptane ring, a cyclooctane ring, a cyclododecane ring, and a cyclodocosane ring. Among those, the cyclohexane ring is preferable, a 1,4-cyclohexylene group is more preferable, and a trans-1,4-cyclohexylene group is still more preferable.

Examples of the substituent which may be contained in the alicyclic ring which is one aspect of the ring $B^{11}$ including suitable aspects thereof, include the same ones as those of the substituent which may be contained in the aromatic ring which is one aspect of the ring $B^{11}$.

The alicyclic ring which is one aspect of ring $B^{11}$ preferably has no substituent.

The forward wavelength dispersion liquid crystal compound A preferably has at least one aromatic ring having 10 or more $\pi$ electrons, which may have a substituent, and more preferably has at least one group represented by Formula (III) which will be described later, as the ring $B^{11}$.

In addition, the forward wavelength dispersion liquid crystal compound A preferably has at least one cyclohexane ring, more preferably has at least one 1,4-cyclohexylene group, and still more preferably has at least one trans-1,4-cyclohexylene group, as the ring $B^{11}$.

That is, the forward wavelength dispersion liquid crystal compound A preferably has a combination consisting of at least one aromatic ring having 10 or more $\pi$ electrons (more preferably a group represented by Formula (III) which will be described later) and at least one cyclohexane ring (more preferably 2 to 4 1,4-cyclohexylene groups), as the ring $B^{11}$.

In the forward wavelength dispersion liquid crystal compound A the number of the rings $B^{11}$ existing on a bond that links the polymerizable groups $P^{11}$ and $P^{12}$ is not particularly limited, but from the viewpoint of the alignment stability of the liquid crystal compound, the number of the rings $B^{11}$ is preferably 3 to 7, more preferably 4 to 6, and still more preferably 5.

In the present invention, the forward wavelength dispersion liquid crystal compound A is preferably a compound represented by Formula (I) for a reason that the optical compensability of the formed optically anisotropic layer is further improved.

$X^{11}$, $X^{12}$, $X^{13}$, $X^{14}$, $X^{15}$, and $X^{16}$ each independently represent a single bond; or —CO—, —O—, —S—, —C(=S)—, $CR^1R^2$—, —$CR^3$=$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms. It should be noted that in a ease where n11 is 2, a plurality of $X^{11}$'s may be the same as or different from each other; in a case where m11 is 2, a plurality of $X^{12}$'s may be the same as or different from each other; in a case where k11 is 2, a plurality of $X^{13}$'s may be the same as or different from each other; in a case where m12 is 2, a plurality of $X^{15}$'s may be the same as or different from each other; and in a case where n12 is 2, a plurality of $X^{16}$'s may be the same as or different from each other.

$Ar^{11}$ and $Ar^{12}$ each independently represent an aromatic ring which may have a substituent. It should be noted that in a ease where n11 is 2, a plurality of $Ar^{11}$'s may be the same as or different from each other; and in a case where n12 is 2, a plurality of $Ar^{12}$'s may be the same as or different from each other.

$Cy^{11}$ and $Cy^{12}$ each independently represent an alicyclic ring which may have a substituent. It should be noted that in a case where m11 is 2, a plurality of $Cy^{11}$'s may be the same as or different from each other; and in a case where m12 is 2, a plurality of $Cy^{12}$'s may be the same as or different from each other.

$Ar^{13}$ represents an aromatic ring having 10 or more $\pi$ electrons, which may have a substituent. It should be noted that in a case where k11 is 2, a plurality of $Ar^{13}$'s may be the same as or different from each other.

In Formula (I), examples of the polymerizable group represented by each of $P^{11}$ and $P^{12}$ include the same ones as those of the above-mentioned polymerizable groups which are radically polymerizable or cationically polymerizable; and among these, the above-mentioned polymerizable groups represented by any of Formulae (P-1) to (P-20) are preferable, and the acryloyloxy group or the methacryloyloxy group is more preferable.

Examples of the linear or branched alkylene group having 1 to 14 carbon atoms shown in one aspect of $Sp^{11}$ and $Sp^{12}$ in Formula (I) include a methylene group, an ethylene group, a propylene group, a butylene group, a pentylene group, a hexylene group, a methylhexylene group, and a heptylene group. Furthermore, as mentioned above, $Sp^{11}$ and $Sp^{12}$ may each be a divalent linking group in which one or more of —$CH_2$—'s constituting these alkylene groups are substituted with —O—, —S—, —NH—, —N(Q)-, or —CO—.

$$P^{11}—Sp^{11}—(X^{11}-Ar^{11})_{n11}-(X^{12}-Cy^{11})_{m11}-(X^{13}-Ar^{13})_{k11}-X^{14}-(Cy^{12}-X^{15})_{m12}—Ar^{12}—X^{16})_{n12}—Sp^{12}—P^{12} \quad (I)$$

In Formula (I), $P^{11}$ and $P^{12}$ each independently represent a polymerizable group.

$Sp^{11}$ and $Sp^{12}$ each independently represent a single bond, a linear or branched alkylene group having 1 to 14 carbon atoms, or a divalent linking group in which one or more of —$CH_2$—'s constituting the linear or branched alkylene group having 1 to 14 carbon atoms are substituted with —O—, —S—, —NH—, —N(Q)-, or —CO—, where Q represents a substituent.

n11, m11, m12, and n12 each independently represent an integer of 0 to 2. It should be noted that at least one of m11 or n11 represents 1 or 2, and at least one of m12 or n12 represents 1 or 2.

k11 represents 1 or 2.

Examples of the substituent represented by Q, including suitable aspects thereof, include the same ones as those of the substituent which may be contained in the aromatic ring which is one aspect of the ring $B^{11}$.

As $Sp^{11}$ and $Sp^{12}$, a linear or branched alkylene group having 1 to 14 carbon atoms (more preferably having 2 to 10 carbon atoms) or a divalent linking group in which one or more of —$CH_2$—'s constituting the linear or branched alkylene group having 2 to 14 carbon atoms (more preferably having 4 to 12 carbon atoms) are substituted with —O— or —CO— is preferable.

In Formula (I), a sum of n11 and m11 and a sum of m12 and n12 are each preferably an integer of 1 to 3, and more preferably 2.

Above those, from the viewpoint of improving the alignment properties of the forward wavelength dispersion liquid crystal compound A, it is preferable that all of n11, m11, m12, and n12 are 1; and from the viewpoint of improving the durability, it is preferable that both of n11 and n12 are 0, and both of m11 and m12 are 2.

In Formula (I), k11 is preferably 1.

In the present invention, the total of n11, m11, k11, m12, and n12 in Formula (I) is preferably an integer of 5 to 10, more preferably an integer of 5 to 7, and still more preferably 5 for a reason that the generation of precipitates is further suppressed.

In Formula (I), examples of the divalent linking group represented by each of $X^{11}$, $X^{12}$, $X^{13}$, $X^{14}$, $X^{15}$, and $X^{16}$ include —CO—, —O—, —CO—O—, —C(=S)O—, $—CR^1R^2$, $—CR^1R^2—CR^1R^2—$, $—O—CR^1R^2—$, $—CR^1R^2—O—CR^1R^2—$, $—CO—O—CR^1R^2—$, $—O—CO—CR^1R^2—$, $—CR^1R^2—O—CO—CR^1R^2—$, $—CR^1R^2—CO—O—CR^1R^2—$, $—NR^5—CR^1R^2—$, and $—CO—NR^5—$. $R^1$, $R^2$, and $R^5$ each independently represent a hydrogen atom, a fluorine atom, or an alkyl group having 1 to 12 carbon atoms.

As $X^{11}$, $X^{12}$, $X^{13}$, $X^{14}$, $X^{15}$, and $X^{16}$, the single bond, —CO—, —O—, or —COO— is preferable.

In the present invention, it is preferable that m11 in Formula (I) is 2, $X^{12}$ existing between two $Cy^{11}$'s a single bond, m12 M Formula (I) is 2, and $X^{15}$ existing between two $Cy^{12}$'s is a single bond for a reason that the stability of the formed optically anisotropic layer is improved.

In Formula (I), the aromatic ring which may have a substituent, represented by each of $Ar^{11}$ and $Ar^{12}$, include the same ones as those of the aromatic ring which may have a substituent, which is one aspect of the ring $B^{11}$.

Among those, an aromatic ring having 6 or 10 π electrons, which may have a substituent, is preferable, an aromatic ring having 6 π electrons, which may have a substituent is more preferable, and a benzene ring (for example, a 1,4-phenylene group) which may have a substituent is still more preferable.

In addition, in Formula (I), examples of the substituent which may be contained in the aromatic ring represented by each of $Ar^{11}$ and $Ar^{12}$, including suitable aspects thereof, include the same ones as those of the substituent which may be contained in the aromatic ring which is one aspect of the ring $B^{11}$.

In Formula (I), examples of the aromatic ring having 10 or more π electrons, which may have a substituent, represented by $Ar^{13}$, include the same ones as those of the aromatic ring having 10 or more π electrons, which may have a substituent, which is one aspect of the ring $B^{11}$.

Among those, as $Ar^{13}$, an aromatic ring having 10 to 18 π electrons, which may have a substituent, is preferable, and an aromatic ring having 10 to 14 π electrons, which may have a substituent, is more preferable from the viewpoint of improving the aligning properties of the forward wavelength dispersion liquid crystal compound A.

In addition, in Formula (I), examples of the substituent which may be contained in the aromatic ring having 10 or more π electrons represented by $Ar^{13}$, including suitable aspects thereof, include the same ones as those of the substituent which may be contained in the aromatic ring which is one aspect of the ring $B^{11}$.

In the present invention, $Ar^{13}$ in Formula (I) is preferably an aromatic hydrocarbon ring which may have a substituent for a reason that the generation of precipitates is further suppressed.

Specific examples of the aromatic hydrocarbon ring include a naphthalene ring, an anthracene ring, and a phenanthrene ring.

In addition, examples of the substituent which may be contained in the aromatic hydrocarbon ring, including suitable aspects thereof, include the same ones as those of the substituent which may be contained in the aromatic ring which is one aspect of the ring $B^{11}$.

In the present invention, it is preferable that $Ar^{13}$ in Formula (I) is an aromatic ring represented by Formula (III) from the viewpoint of improving the aligning properties.

(III)

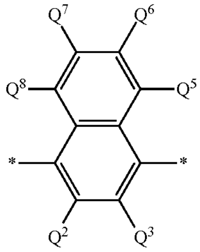

In Formula (III),

* represents a bonding position to $X^{13}$ or $X^{14}$.

$Q^2$, $Q^3$, $Q^5$, $Q^6$, $Q^7$, and $Q^8$ each independently represent a hydrogen atom or a substituent.

In Formula (III), it is preferable that all of $Q^2$, $Q^3$, $Q^5$, $Q^6$, $Q^7$, and $Q^8$ are hydrogen atoms, or one or two of $Q^2$, $Q^3$, $Q^5$, $Q^6$, $Q^7$, and $Q^8$ represent substituents. Among those, it is more preferable that one or two of $Q^2$, $Q^3$, $Q^5$, $Q^6$, $Q^7$, and $Q^8$ represent substituents and the others represent hydrogen atoms; and it is still more preferable that one represents a substituent and the others represent hydrogen atoms.

In Formula (III), it is preferable that the group representing a substituent among $Q^2$, $Q^3$, $Q^5$, $Q^6$, $Q^7$, and $Q^8$ is any of $Q^5$, $Q^6$, $Q^7$, and $Q^8$ and it is more preferable that at least one of $Q^5$ or $Q^8$ is a substituent and at least one of $Q^6$ or $Q^7$ represents a substituent.

As the substituent represented by each of $Q^2$, $Q^3$, $Q^5$, $Q^6$, $Q^7$, and $Q^8$ in Formula (III), including suitable aspects thereof, include the same ones as those of the substituent which may be contained in the aromatic ring which is one aspect of the ring $B^{11}$.

Among those, an alkyl group having 1 to 4 carbon atoms, an alkoxy group having 1 to 4 carbon atoms, a group in which an oxycarbonyl group is bonded to an alkyl group having 1 to 4 carbon atoms, a group in which a carbonyloxy group is bonded to an alkyl group having 1 to 4 carbon atoms, a fluorine atom, or a chlorine atom is preferable, and the alkyl group having 1 to 4 carbon atoms, a methoxy group, an ethoxy group, a methoxycarbonyl group, or a methylcarbonyloxy group is more preferable.

Moreover, suitable specific examples of $Ar^{13}$ in Formula include groups represented by Formulae (IV-1) to (IV-3).

(IV-1)

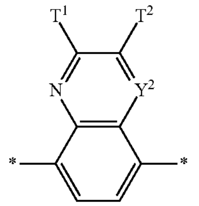

(IV-2)

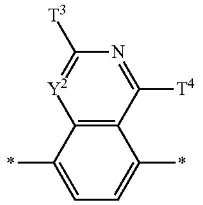

(IV-3)

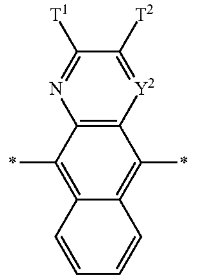

In Formulae (IV-1) to (IV-3), $Y^2$ represents —C(Ry)═ or —N═, and Ry is a hydrogen atom, a fluorine atom, a chlorine atom, a trifluoromethyl group, a trifluoromethoxy group, an alkyl group having 1 to 12 carbon atoms, or a phenyl group.

In Formulae (IV-1) to (IV-3), $T^1$, $T^2$, and $T^3$ each independently represent a hydrogen atom, a fluorine atom, a chlorine atom, a trifluoromethyl group, a trifluoromethoxy group, an alkyl group having 1 to 12 carbon atoms, azo alkoxy group having 1 to 12 carbon atoms, an alkoxycarbonyl group having 1 to 12 carbon atoms, an alkylcarbonyl group having 1 to 12 carbon atoms, an aromatic rings having the number of a electrons of 6 to 18, or a monovalent organic group in which at least one of —$CH_2$—'s in the alkyl group, the alkoxy group, the alkoxycarbonyl group, or the alkylcarbonyl group is substituted with —O—, —CO—, or —S—. In addition, $T^1$ and $T^2$ may be bonded to each other to form a ring.

In Formulae (IV-1) to (IV-3), $T^4$'s independently represent a hydrogen atom, a fluorine atom, a chlorine atom, a trifluoromethyl group, a trifluoromethoxy group, an alkyl group having 1 to 12 carbon atoms, or a phenyl group. * represents a bonding position to $X^{13}$ or $X^{14}$.

In Formula (I), the alicyclic ring which may have a substituent, represented by each of $Cy^{11}$ and $Cy^{12}$, including suitable aspects thereof, include the same ones as those of the alicyclic ring, which may have a substituent, which is one aspect of the ring $B^{11}$.

Among those, the cycloalkane ring having 5 to 20 carbon atoms, which may have a substituent, is preferable, the cyclohexane ring which may have a substituent is more preferable, the 1,4-cyclohexylene group is still more preferable, and the trans-1,4-cyclohexylene group is particularly preferable.

In addition, in Formula (I), examples of the substituent which may be contained in the alicyclic ring represented by each of $Cy^{11}$ and $Cy^{12}$, including suitable aspects thereof, include the same ones as those of the substituent which may be contained in the aromatic ring which is one aspect of the ring $B^{11}$.

In addition, examples of the compound represented by Formula (I) include a compound (1-1) to a compound (1-19) represented by the following formulae. Moreover, a group adjacent to the acryloyloxy group in the structure of the compound (1-14) represents a propylene group (a group obtained by substituting a methyl group with an ethylene group), and the compound (1-14) represents a mixture of regioisomers in which the positions of the methyl groups are different.

(1-1)

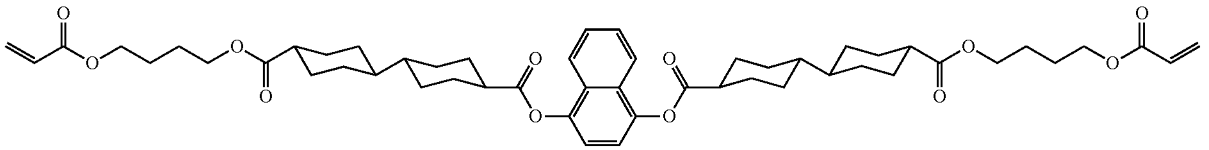

(1-2)

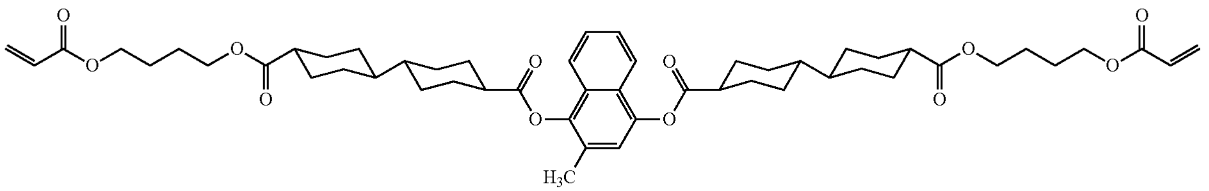

(1-3)

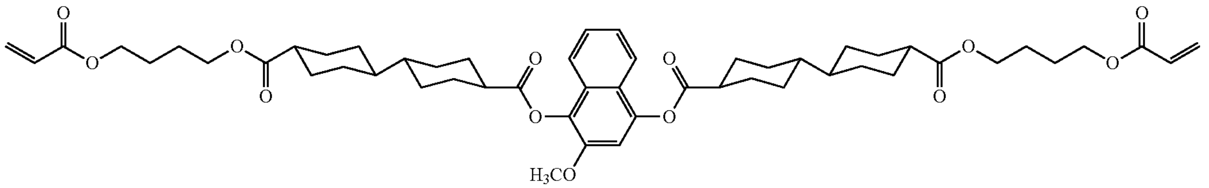

-continued
(1-4)
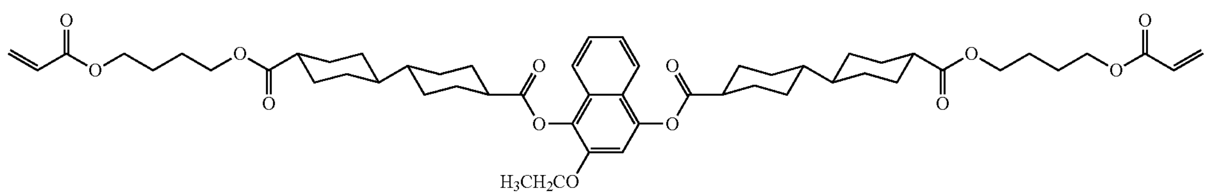
(1-5)
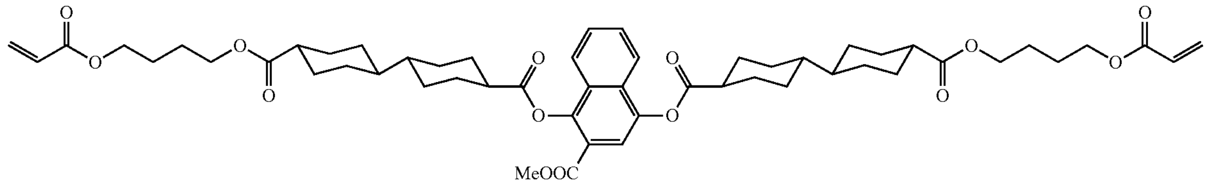
(1-6)
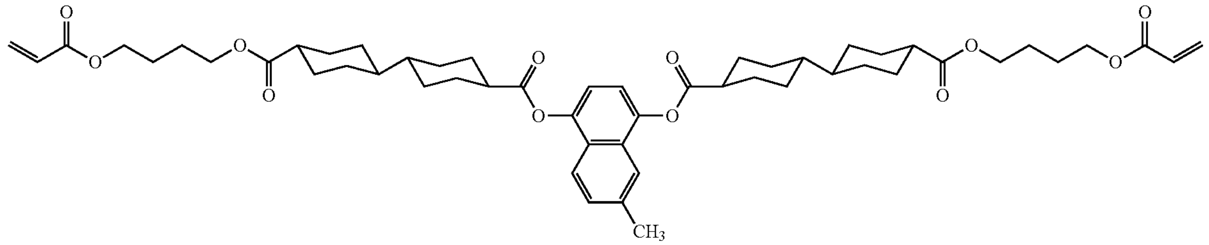
(1-7)
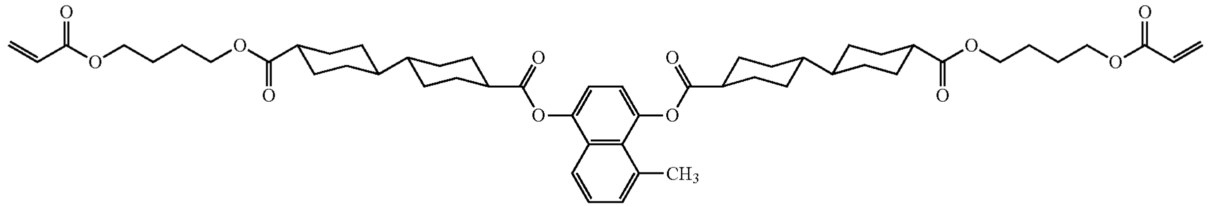
(1-8)
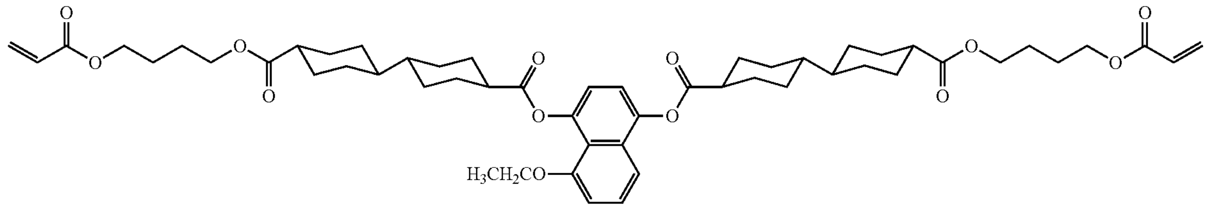
(1-9)
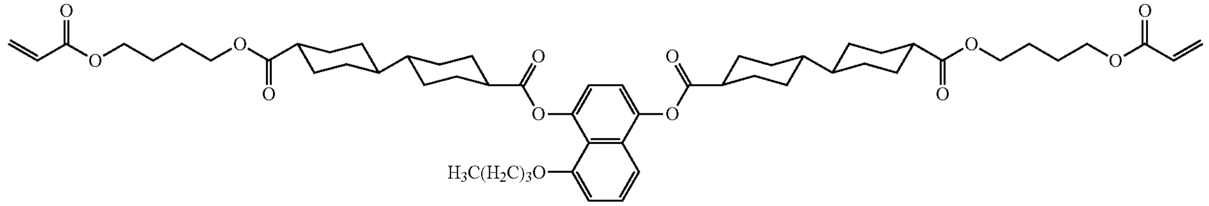
(1-10)
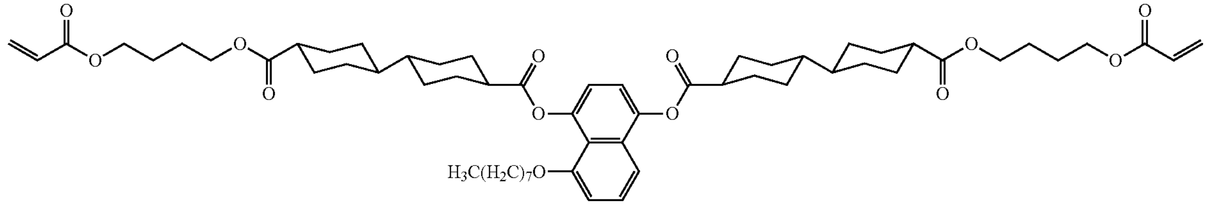

-continued
(1-11)
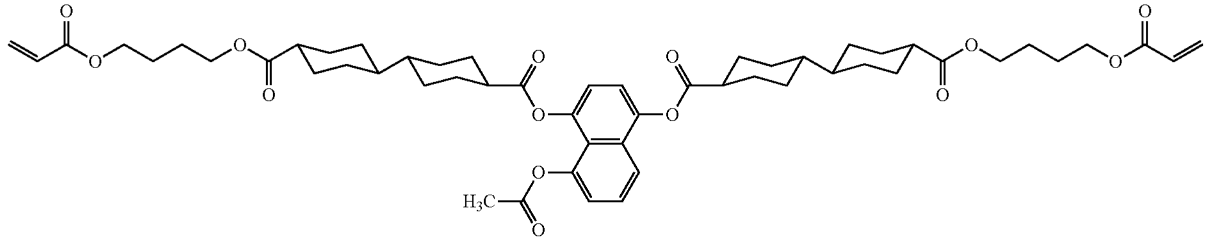
(1-12)
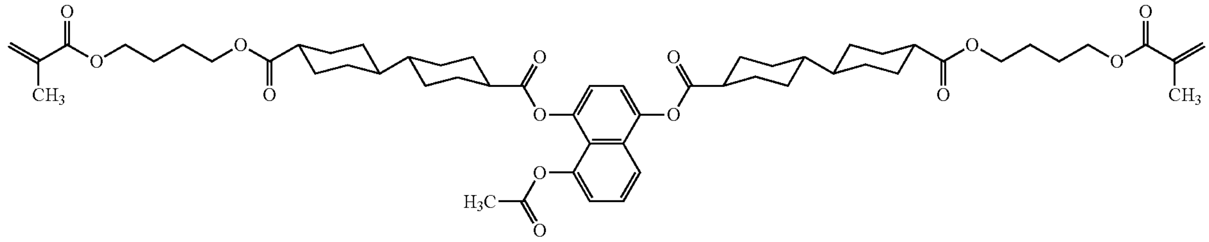
(1-13)
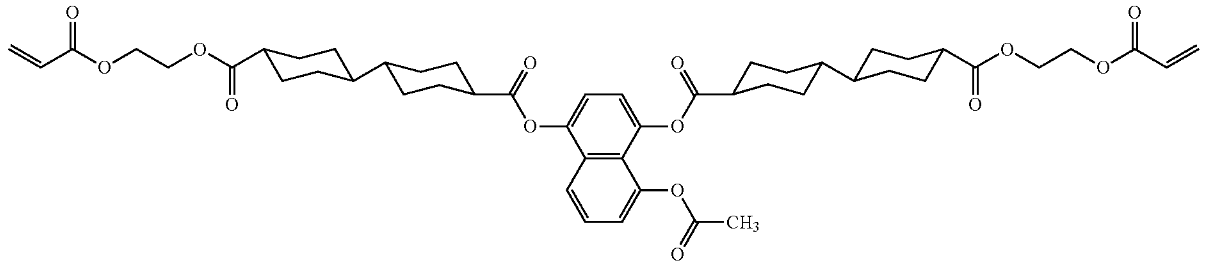
(1-14)
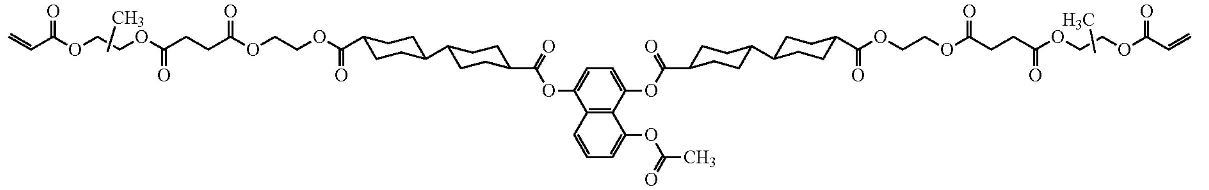
(1-15)
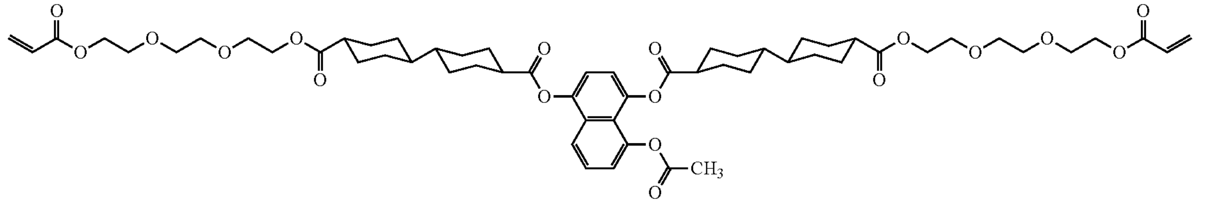
(1-16)
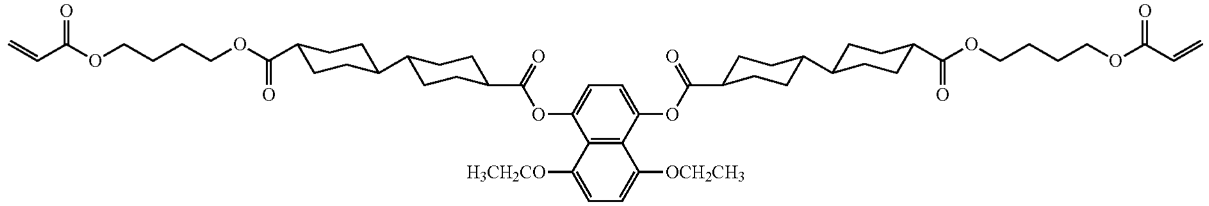

-continued (1-17)

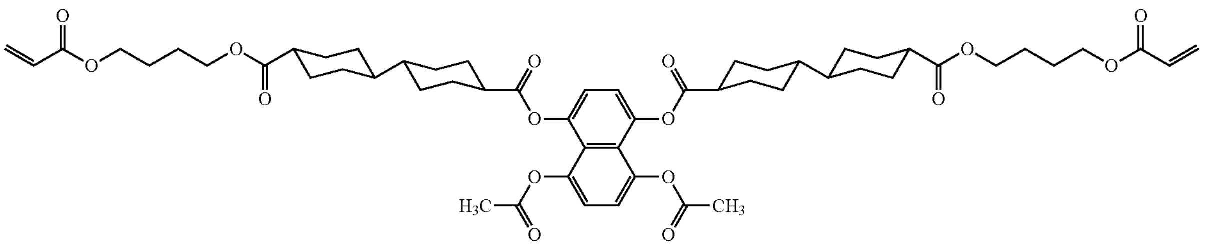

(1-18)

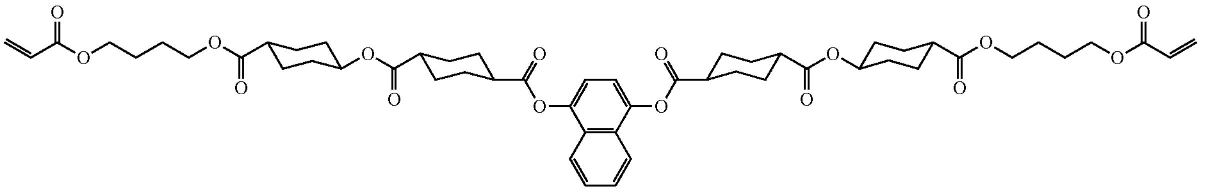

(1-19)

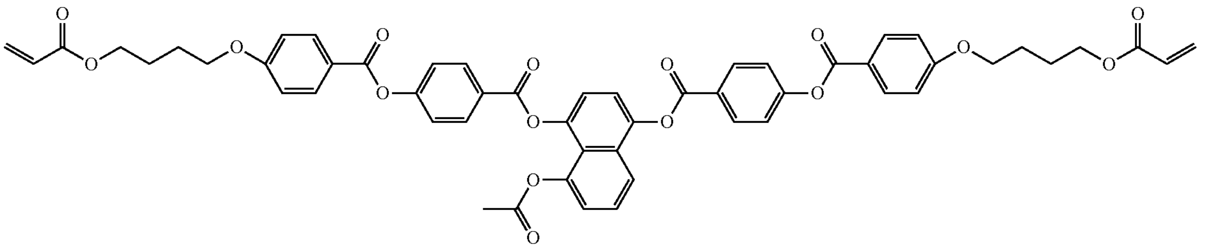

[Forward Wavelength Dispersion Liquid Crystal Compound B]

The forward wavelength dispersion liquid crystal compound B contained in the polymerizable liquid crystal composition of the embodiment of the present invention is a forward wavelength dispersion liquid crystal compound having an aromatic ring having 6 or more and less than 10 π electrons.

In the present invention, the forward wavelength dispersion liquid crystal compound B is preferably a compound having polymerizable groups $P^{21}$ and $P^{22}$ constituting one terminal and the other terminal of the forward wavelength dispersion liquid crystal compound B, respectively, and three or more rings $B^{21}$ selected from the group consisting of an aromatic ring which may have a substituent and an alicyclic ring which may have a substituent, and existing on a bond that links the polymerizable groups $P^{21}$ and $P^{22}$.

Here, the expression, the ring $B^{21}$ "existing on a bond that links the polymerizable groups $P^{21}$ and $P^{22}$", means that the ring $B^{21}$ constitutes a part of a portion necessary for directly linking the polymerizable groups $P^{21}$ and $P^{22}$. Furthermore, the forward wavelength dispersion liquid crystal compound B may have a portion other than the portion necessary for directly linking the polymerizable groups $P^{21}$ and $P^{22}$ (hereinafter also simply referred to as a "side chain"), but it is construed that the ring structure constituting a part of the side chain is not included in the ring $B^{21}$.

In addition, the two polymerizable groups $P^{21}$ and $P^{22}$ of the forward wavelength dispersion liquid crystal compound B may be the same as or different from each other, and the three or more rings $B^{21}$ contained in the forward wavelength dispersion liquid crystal compound B may be the same as or different from each other.

Examples of the polymerizable groups $P^{21}$ and $P^{22}$ include the same ones as those of the polymerizable groups $P^{11}$ and $P^{22}$, respectively, described in the forward wavelength dispersion liquid crystal compound A, and suitable aspects thereof are also the same.

The forward wavelength dispersion liquid crystal compound B may have three or more polymerizable groups. In a case where the polymerizable liquid crystal compound has three or more polymerizable groups, the polymerizable group other than the above-mentioned polymerizable groups $P^{21}$ and $P^{22}$ is not particularly limited, and examples of the polymerizable group, including suitable aspects thereof, include the same ones as those of the polymerizable group which is radically polymerizable or cationically polymerizable.

The number of polymerizable groups contained in the polymerizable liquid crystal compound is preferably 2 to 4, and more preferably only two of the polymerizable groups $P^{21}$ and $P^{22}$ are contained.

In addition, examples of the ring $B^{21}$ include the same ones as those of the ring $B^{11}$ described in the forward wavelength dispersion liquid crystal compound A.

Among those, the forward wavelength dispersion liquid crystal compound B preferably has at least one aromatic ring having 6 or more and less than 10 π electrons, which may have a substituent, and more preferably has a benzene ring (for example, a 1,4-phenylene group) as the ring $B^{21}$.

In addition, the forward wavelength dispersion liquid crystal compound B preferably has at least one cyclohexane ring, more preferably has at least one 1,4-cyclohexylene group, and still more preferably has at least one trans-1,4-cyclohexylene group as the ring $B^{21}$.

That is, the forward wavelength dispersion liquid crystal compound B preferably has a combination consisting of at least one aromatic ring (more preferably a 1,4-phenylene group) having 6 or more and less than 10 π electrons, and at least one cyclohexane ring (more preferably two to four 1,4-cyclohexylene groups) as the ring $B^{21}$.

In the present invention, the forward wavelength dispersion liquid crystal compound B is preferably a compound represented by Formula (II) for a reason that the optical compensability of the formed optically anisotropic layer is further improved.

$$P^{21}—Sp^{21}—(X^{21}—Ar^{21})_{n21}—(X^{22}—Cy^{21})_{m21}—(X^{23}—Ar^{23})_{k21}—X^{24}—(Cy^{22}—X^{25})_{m22}—Ar^{22}—X^{26})_{n22}—Sp^{22}—P^{22} \quad (II)$$

Here, in Formula (II), $P^{21}$ and $P^{12}$ each independently represent a polymerizable group.

$Sp^{21}$ and $Sp^{22}$ each independently represent a single bond, a linear or branched alkylene group having 1 to 14 carbon atoms, or a divalent linking group in which one or more of $—CH_2—$'s constituting the linear or branched alkylene group having 1 to 14 carbon atoms are substituted with —O—, —S—, —NH—, —N(Q)-, or —CO—, where Q represents a substituent.

n21, m21, m22, and n22 each independently represent an integer of 0 to 2. It should be noted that at least one of m21 or n21 represents 1 or 2, and at least one of m22 or n22 represents 1 or 2.

k21 represents 1 or 2.

$X^{21}$, $X^{22}$, $X^{23}$, $X^{24}$, $X^{25}$, and $X^{26}$ each independently represent a single bond; or —CO—, —O—, —C(=S)S—, $—CR^1R^2—$, $—CR^3=CR^4—$, $—NR^5—$, or a divalent linking group consisting of a combination of two or more of these groups, where $R^1$ to $R^5$ each independently represent a hydrogen atom, a fluorine atom, or an alkyl group having 1 to 12 carbon atoms. It should be noted that in a case where n21 is 2, a plurality of $X^{21}$'s may be the same as or different from each other; in a case where m21 is 2, a plurality of $X^{22}$'s may be the same as or different from each other; in a case where k21 is 2, a plurality of $X^{23}$'s may be the same as or different from each other; in a case where m22 is 2, a plurality of $X^{25}$'s may be the same as or different from each other; and in a case where n22 is 2, a plurality of $X^{26}$'s may be the same as or different from each other.

$Ar^{21}$ and $Ar^{22}$ each independently represent an aromatic ring which may have a substituent. It should be noted that in a case where n21 is 2, a plurality of $Ar^{21}$'s may be the same as or different from each other; and in a case where n22 is 2, a plurality of $Ar^{22}$'s may be the same as or different from each other.

$Cy^{21}$ and $Cy^{22}$ each independently represent an alicyclic ring which may have a substituent. It should be noted that in a case where m21 is 2, a plurality of $Cy^{21}$'s may be the same as or different from each other; and in a case where m22 is 2, a plurality of $Cy^{22}$'s may be the same as or different from each other.

$Ar^{23}$ represents an aromatic ring having 6 or more and less than 10 π electrons, which may have a substituent. It should be noted that in a case where k21 is 2, a plurality of $Ar^{23}$'s may be the same as or different from each other.

In Formula (II), examples of $P^{21}$ and $P^{22}$ include the same ones as those described in $P^{11}$ and $P^{12}$ in Formula (I), respectively, and suitable aspects thereof are also the same.

In addition, examples of $Sp^{21}$ and $Sp^{22}$ include the same ones as those described in $Sp^{11}$ and $Sp^{12}$ in Formula (I), respectively, and suitable aspects thereof are also the same.

Moreover, examples of n21, m21, m22, and n22 include the same ones as those described in n11, m11, m12, and n12 in Formula (I), respectively, and suitable aspects thereof are also the same.

In addition, examples of k21 include the same ones as those described in k11 in Formula (I), and suitable aspects thereof are also the same.

Furthermore, examples of $X^{21}$, $X^{22}$, $X^{23}$, $X^{24}$, $X^{25}$, and $X^{26}$ include the same ones as those described for $X^{11}$, $X^{12}$, $X^{13}$, $X^{15}$, and $X^{16}$ in Formula (I), respectively, and suitable aspects thereof are also the same.

Moreover, examples of $Ar^{21}$ and $Ar^{22}$ include the same ones as those described for $Ar^{11}$ and $Ar^{12}$ in Formula (I), respectively, and suitable aspects thereof are also the same.

In addition, examples of $Cy^{21}$ and $Cy^{22}$ include the same ones as those described for $Cy^{11}$ and $Cy^{12}$, in Formula (I), respectively, and suitable aspects thereof are also the same.

On the other hand, in Formula (II), examples of the aromatic ring having 6 or more and less than 10 π electrons, which may have a substituent, represented by $Ar^{23}$, include the same ones as those of the aromatic ring having 6 or more and less than 10 π electrons, among the aromatic rings which may have a substituent, which is one aspect of the ring $B^{11}$.

Among those, the benzene ring (for example, a 1,4-phenylene group) is preferable.

In addition, in Formula (II), examples of the substituent which may be contained in the aromatic ring having 6 or more and less than 10 π electrons represented by $Ar^{23}$, including suitable aspects thereof, include the same ones as those of the substituent which may be contained in the aromatic ring which is one aspect of the ring $B^{11}$.

In the present invention, for a reason that the stability of the formed optically anisotropic layer is improved, in Formula (II), it is preferable that m21 is 2 and $X^{22}$ existing between two $Cy^{21}$'s a single bond, and m22 is 2 and $X^{25}$ existing between two $Cy^{22}$'s is a single bond.

In the present invention, the total of n21, m21, k21, m22, and n22 in Formula (II) is preferably an integer of 5 to 10, more preferably an integer of 5 to 7, and still more preferably 5 for a reason that the generation of precipitates is further suppressed.

In the present invention, $Ar^{23}$ in Formula (II) is preferably an aromatic hydrocarbon ring which may have a substituent for a reason that the generation of precipitates is further suppressed.

Specific examples of the aromatic hydrocarbon ring include a benzene ring.

In addition, examples of the substituent which may be contained in the aromatic hydrocarbon ring, including suitable aspects thereof, include the same ones as those of the substituent which may be contained in the aromatic ring which is one aspect of the ring $B^{11}$.

In addition, examples of the compound represented by Formula (II) include a compound (2-1) to a compound (2-5) represented by the following formulae, In addition, as other examples of the compound represented by Formula (II), the polymerizable compounds described in paragraphs [0059] to [0061] of WO2019/160014A and the polymerizable compounds described in paragraph [0055] of WO2019/160016A.

(2-1)

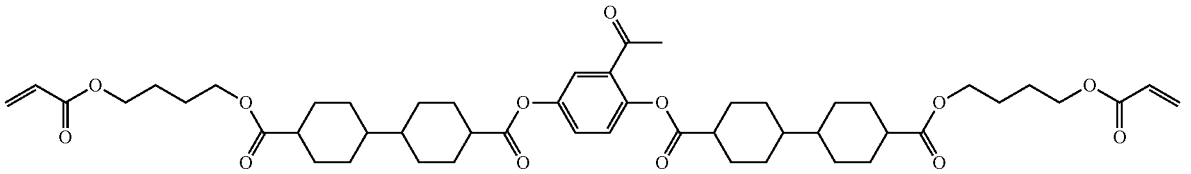

(2-2)

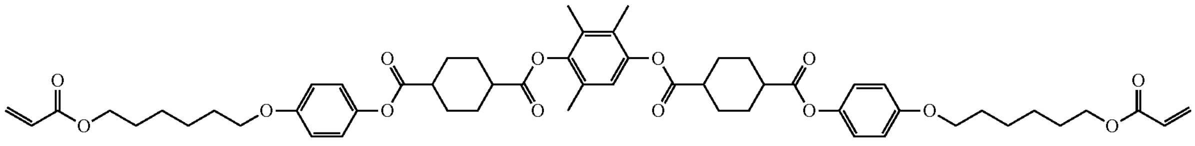

(2-3)

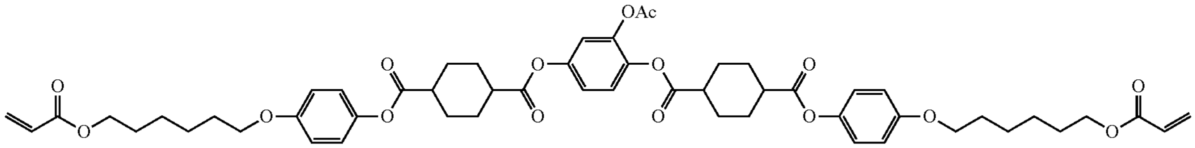

(2-4)

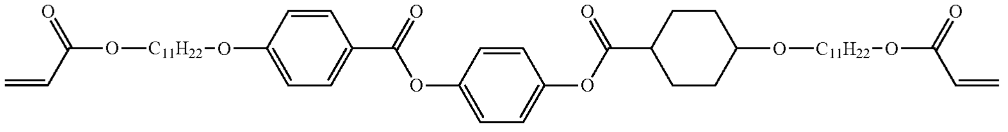

(2-5)

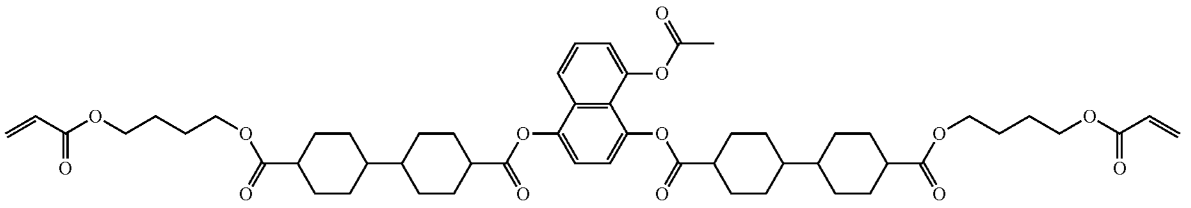

In the present invention, for a reason that the generation of precipitates is further suppressed, it is preferable that the array of the rings $B^{11}$ arranged in order from the polymerizable group $P^{11}$ or $P^{32}$ in the above-mentioned forward wavelength dispersion liquid crystal compound A is the same as the array of the rings $B^{21}$ arranged in order from the polymerizable group $P^{21}$ or $P^{22}$ in the above-mentioned forward wavelength dispersion liquid crystal compound B.

Here, with regard to the array of the rings in the forward wavelength dispersion liquid crystal compound A and the forward wavelength dispersion liquid crystal compound B, in a ease where all of objects to be compared are aromatic rings, it is considered that the rings constitute the same array even though the rings have different ring structures or substituents; and in a ease where all of objects to be compared are alicyclic rings, it is considered that the rings constitute the same array even though the rings have different ring structures or substituents. The array of the rings is construed not to include a structure of a linking portion between two rings. In a case where all of rings to be compared are aromatic rings, it is considered that the rings constitute the same array even though the rings have different skeletons as in cases with, for example, a phenylene group and a naphthylene group; and in a ease where all of rings to be compared are alicyclic rings, it is considered that they rings constitute the same array even though the rings have different skeletons as in cases with, for example, cyclohexylene and cyclopentalene.

In the present invention, for a reason that the generation of precipitates is further suppressed, it is preferable that the structure other than $Ar^{13}$ in Formula (I) in the above-mentioned forward wavelength-dispersible liquid crystal compound A and the structure other than $Ar^{23}$ in Formula (II) in the above-mentioned forward wavelength-dispersible liquid crystal compound B are the same structures.

In the polymerizable liquid crystal composition of the embodiment of the present invention, a blending ratio of the above-mentioned forward wavelength dispersion liquid crystal compound A and the above-mentioned forward wavelength dispersion liquid crystal compound B is not particularly limited, but a mass ratio (A/B) of the forward wavelength dispersion liquid crystal compound A to the forward wavelength dispersion liquid crystal compound B is preferably 10/90 to 90/10, and more preferably 30/70 to 70/30.

[Reverse Wavelength Dispersion Liquid Crystal Compound]

For a reason that the optical compensability of the formed optically anisotropic layer is further improved, it is preferable that the polymerizable liquid crystal composition of the embodiment of the present invention contains a reverse wavelength dispersion liquid crystal compound having any of aromatic rings selected from the group consisting of groups represented by Formulae (Ar-1) to (Ar-7).

Here, in the present specification, the "reverse wavelength dispersion" liquid crystal compound means that in a ease where an in-plane retardation (Re) value at a specific wavelength (visible light range) of a phase difference film manufactured using the compound is measured, the Re value is equal or higher as a measurement wavelength is increased.

(Ar-1)

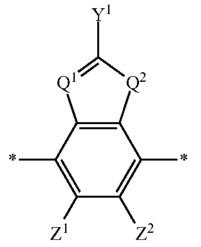

(Ar-2)

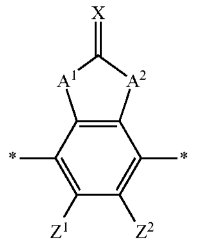

(Ar-3)

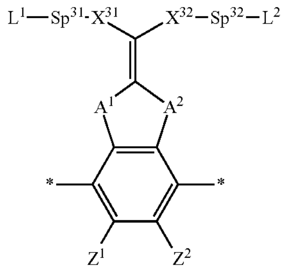

(Ar-4)

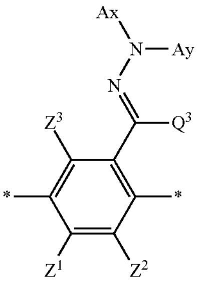

(Ar-5)

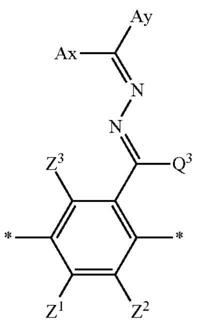

-continued (Ar-6)

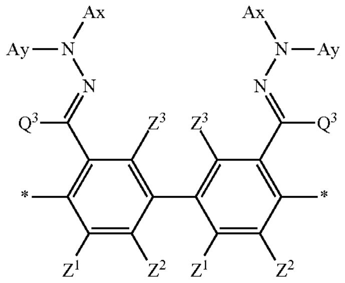

(Ar-7)

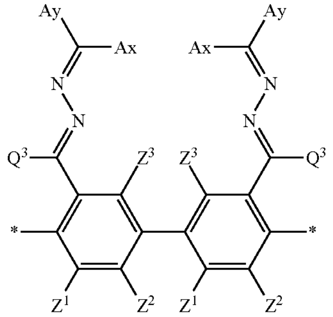

In Formulae (Ar-1) to (Ar-7), * represents a bonding position, that is, a bonding position to a portion other than the aromatic ring included in the reverse wavelength dispersion liquid crystal compound.

In addition, in Formula (Ar-1), $Q^1$ represents N or CH, $Q^2$ represents —S—, —O—, or —N($R^6$)—, $R^6$ represents a hydrogen atom or an alkyl group having 1 to 6 carbon atoms, $Y^1$ represents an aromatic hydrocarbon group having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, and one or more of constituting the alicyclic hydrocarbon group may be substituted with —O—, —S—, or —NH—.

Here, examples of the alkyl group having 1 to 6 carbon atoms, represented by $R^6$, include a methyl group, an ethyl group, a propyl group, an isopropyl group, an n-butyl group, an isobutyl group, a sec-butyl group, a tert-butyl group, an n-pentyl group, and an n-hexyl group.

In addition, examples of the aromatic hydrocarbon group having 6 to 12 carbon atoms, represented by $Y^1$, include aryl groups such as a phenyl group, a 2,6-diethylphenyl group, and a naphthyl group.

Examples of the aromatic heterocyclic group having 3 to 12 carbon atoms represented by $Y^1$ include heteroaryl groups such as a thienyl group, a thiazolyl group, a furyl group, and a pyridyl group.

Examples of the alicyclic hydrocarbon group having 6 to 20 carbon atoms represented by $Y^1$, include a cyclohexylene group, a cyclopentylene group, a norbornene group, and an adamantylene group.

Examples of the substituent which may be contained in $Y^1$, including suitable aspects thereof, include the same ones as the substituents which may be contained in the aromatic ring or the alicyclic ring which is one aspect of the ring $B^1$.

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 3 to 20 carbon atoms, a halogen atom, a cyano group, a nitro group, —$OR^7$, —$NR^8R^9$, —$SR^{10}$, —$COOR^{11}$, or —$COR^{12}$, where $R^7$ to $R^{12}$ each independently represent a hydrogen atom or an alkyl group having 1 to 6 carbon atoms, and $Z^1$ and $Z^2$ may be bonded to each other to form an aromatic ring.

Here, as the monovalent aliphatic hydrocarbon group having 1 to 20 carbon atoms, an alkyl group having 1 to 15 carbon atoms is preferable, an alkyl group having 1 to 8 carbon atoms is more preferable, a methyl group, an ethyl group, an isopropyl group, a tert-pentyl group (1,1-dimethylpropyl group), a text-butyl group, or a 1,1-dimethyl-3,3-dimethyl-butyl group is still more preferable, and the methyl group, the ethyl group, or the tert-butyl group is particularly preferable.

Examples of the monovalent alicyclic hydrocarbon group having 3 to 20 carbon atoms include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene; and polycyclic saturated hydrocarbon groups such as a bicyclo[2.2.1]heptyl group, a bicyclo[2.2.2]octyl group, a tricyclo[$5.2.1.0^{2,6}$]decyl group, a tricyclo[$3.3.1.1^{3,7}$]decyl group, a tetracyclo[$6.2.1.1^{3,6}.0^{2,7}$]dodecyl group, and an adamantyl group.

Examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Examples of the monovalent aromatic heterocyclic group having 3 to 20 carbon atoms include a 4-pyridyl group, a 2-furyl group, a 2-thienyl group, a 2-pyrimidinyl group, and a 2-benzothiazolyl group.

Examples of the halogen atom include a fluorine atom, a chlorine atom, a bromine atom, and an iodine atom, and among these, the fluorine atom, the chlorine atom, or the bromine atom is preferable.

On the other hand, examples of the alkyl group having 1 to 6 carbon atoms, represented by each of $R^7$ to $R^{12}$, include a methyl group, an ethyl group, a propyl group, an isopropyl group, an n-butyl group, an isobutyl group, a sec-butyl group, a tert-butyl group, an n-pentyl group, and an n-hexyl group.

In addition, $Z^1$ and $Z^2$ may be bonded to each other to form an aromatic ring, as mentioned above. Examples of the structure in a case where $Z^1$ and $Z^2$ in Formula (Ar-1) are bonded to each other to form an aromatic ring include a group represented by Formula (Ar-1a). Furthermore, in Formula (Ar-1a), * represents a bonding position, and examples of $Q^1$, $Q^2$, and $Y^1$, including suitable aspects thereof, include the same ones as those described for Formula (Ar-1).

(Ar-1a)

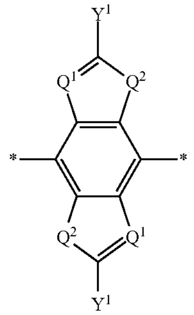

In addition, in Formula (Ar-2), $A^1$ and $A^2$ each independently represent a group selected from the group consisting of —O—, —$N(R^{13})$—, —S—, and —CO—, and $R^{13}$ represents a hydrogen atom or a substituent.

Examples of the substituent represented by $R^{13}$, including suitable aspects thereof, include the same ones as the substituents which may be contained in the aromatic ring or the alicyclic ring which is one aspect of the ring $B^{11}$.

In addition, in Formula (Ar-2), X represents a hydrogen atom or a non-metal atom of Groups XIV to XVI, to which a substituent may be bonded.

Furthermore, examples of the non-metal atom of Groups XIV to XVI represented by X include an oxygen atom, a sulfur atom, a nitrogen atom to which a hydrogen atom or a substituent is bonded [=N—$R^{N1}$, $R^{N1}$ represents a hydrogen atom or a substituent], and a carbon atom to which a hydrogen atom or a substituent is bonded [=C—$(R^{C1})_2$, $R^{C1}$ represents a hydrogen atom or a substituent].

Examples of the substituent include an alkyl group, an alkoxy group, an alkyl-substituted all oxy group, a cyclic alkyl group, an aryl group (for example, a phenyl group and a naphthyl group), a cyano group, an amino group, a nitro group, an alkylcarbonyl group, a sulfo group, and a hydroxyl group.

In addition, in Formula (Ar-3), $X^{31}$ and $X^{32}$ each independently represent a single bond; or —CO—, —O—, —S—, —$CR^1R^2$—, —$CR^3$=$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms.

Here, examples of the divalent linking group represented by one aspect of $X^{31}$ and $X^{32}$ include —CO—, —O—, —CO—O—, —C(=S)O—, —$CR^1R^2$—, —$CR^1R^2$—$CR^1R^2$—, —O—$CR^1R^2$—, —$CR^1R^2$—O—$CR^1R^2$—, —CO—O—$CR^1R^2$—, —O—CO—$CR^1R^2$—, —$CR^1R^2$—O—CO—$CR^1R^2$—, —$CR^1R^2$—CO—O—$CR^1R^2$—, —$NR^5$—$CR^1R^2$—, and —CO—$NR^5$—. $R^1$, $R^2$, and $R^5$ each independently represent a hydrogen atom, a fluorine atom, or an alkyl group having 1 to 12 carbon atoms.

Among those, any of —CO—, —O—, and —CO—O— is preferable.

Moreover, in Formula. (Ar-3), $Sp^{31}$ and $Sp^{32}$ each independently represent a single bond, a linear or branched alkylene group having 1 to 14 carbon atoms, or a divalent linking group in which one or more of —$CH_2$—'s constituting the linear or branched alkylene group having 1 to 14 carbon atoms are substituted with —O—, —S—, —NH—, —N(Q)-, or —CO—, where represents a substituent.

Here, examples of the linear or branched alkylene group having 1 to 14 carbon atoms, represented by one aspect of $Sp^{31}$ and $Sp^{32}$, include a methylene group, an ethylene group, a propylene group, a butylene group, a pentylene group, a hexylene group, a methylhexylene group, and a heptylene group. Furthermore, as mentioned above, $Sp^{31}$ and $Sp^{32}$ may each be a divalent linking group in which one or more of $—CH_2—$'s constituting these alkylene groups are substituted with —O—, —S—, —NH—, —N(Q)-, or —CO—.

Examples of the substituent represented by Q, including suitable aspects thereof, include the same ones as the substituents which may be contained in the aromatic ring or the alicyclic ring which is one aspect of the ring $B^{11}$.

In addition, in Formula (Ar-3), $L^1$ and $L^2$ each independently represent a monovalent organic group, and at least one of $L^1$ or $L^2$ represents a polymerizable group.

Examples of each of Ax and Ay include the ones described in paragraphs [0039] to [0095] of WO2014/010325A.

Incidentally, specific examples of the alkyl group having 1 to 6 carbon atoms, represented by $Q^3$, include a methyl group, an ethyl group, a propyl group, an isopropyl group, an n-butyl group, an isobutyl group, a sec-butyl group, a tert-butyl group, an n-pentyl group, and an n-hexyl group, and examples of the substituent, including suitable aspects thereof, include the same ones as the substituents which may be contained in the aromatic ring or the alicyclic ring which is one aspect of the ring $B^{11}$.

The reverse wavelength dispersion liquid crystal compound is preferably a compound represented by Formula (V) for a reason that the optical compensability is further improved.

$$P^{51}—Sp^{51}—(X^{51}—Ar^{51})_{n51}—(X^{52}—Cy^{51})_{m51}—(X^{53}—Ar^{53})_{k51}—X^{54}—(Cy^{52}—X^{55})_{m52}—(Ar^{52}—X^{56})_{n52}—Sp^{52}—P^{52} \quad (V)$$

Here, examples of the monovalent organic group represented by each of $L^1$ and $L^2$ include an alkyl group, an aryl group, and a heteroaryl group. The alkyl group may be linear, branched, or cyclic, but is preferably linear. The alkyl group preferably has 1 to 10 carbon atoms. In addition, the aryl group may be a monocycle or a polycycle, but is preferably the monocycle. The number of carbon atoms of the aryl group is preferably 6 to 25, and more preferably 6 to 10. Further, the heteroaryl group may be a monocycle or a polycycle. The number of heteroatoms constituting the heteroaryl group is preferably 1 to 3. The heteroatoms constituting the heteroaryl group are preferably a nitrogen atom, a sulfur atom, or an oxygen atom. The number of carbon atoms of the heteroaryl group is preferably 6 to 18, and more preferably 6 to 12.

In addition, the alkyl group, the aryl group, and the heteroaryl group may be unsubstituted or have a substituent, Examples of the substituent, including suitable aspects thereof, include the same ones as the substituents which may be contained in the aromatic ring or the alicyclic ring which is one aspect of the ring $B^{11}$.

In addition, examples of the polymerizable group represented by at least one of $L^1$ or $L^2$ include the same ones as the above-mentioned polymerizable groups which are radically polymerizable or canonically polymerizable, and among these, suitable examples thereof include the above-mentioned polymerizable groups represented by any of Formulae (P-1) to (P-20).

Moreover, in Formulae (Ar-4) to (Ar-7), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) to (Ar-7), Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom or an alkyl group having 1 to 6 carbon atoms, which may have a substituent.

Here, in Formula (V), $P^{51}$ and $P^{52}$ each independently represent a polymerizable group.

$Sp^{51}$ and $Sp^{52}$ each independently represent a single bond, a linear or branched alkylene group having 1 to 14 carbon atoms, or a divalent linking group in which one or more of constituting the linear or branched alkylene group having 1 to 14 carbon atoms are substituted with —O—, —S—, —NH—, —N(Q)-, or —CO—, where Q represents a substituent.

n51, m51, m52, and n52 each independently represent an integer of 0 to 2. It should be noted that at least one of m51 or n51 represents 1 or 2, and at least one of m52 or n52 represents 1 or 2.

k51 represents 1 or 2.

$X^{51}$, $X^{52}$, $X^{53}$, $X^{54}$, $X^{55}$, and $X^{56}$ each independently represent a single bond; or —CO—, —O—, —C(=S)—, $—CR^1R^2—$, $—CR^3{=}CR^4—$, $—NR^5—$, or a divalent linking group consisting of a combination of two or more of these groups, where $R^1$ to $R^5$ each independently represent a hydrogen atom, a fluorine atom, or an alkyl group having 1 to 12 carbon atoms. It should be noted that in a case where n51 is 2, a plurality of $X^{51}$'s may be the same as or different from each other; in a case where m51 is 2, a plurality of $X^{52}$'s may be the same as or different from each other; in a case where k51 is 2, a plurality of $X^{53}$'s may be the same as or different from each other; in a case where m52 is 2, a plurality of $X^{55}$'s may be the same as or different from each other; and in a case where n52 is 2, a plurality of $X^{56}$'s may be the same as or different from each other.

$Ar^{51}$ and $Ar^{52}$ each independently represent an aromatic ring which may have a substituent. It should be noted that in a case where n51 is 2, a plurality of $Ar^{51}$'s may be the same as or different from each other; and in a case where n52 is 2, a plurality of $Ar^{52}$'s may be the same as or different from each other.

$Cy^{51}$ and $Cy^{52}$ each independently represent an alicyclic ring which may have a substituent. It should be noted that in a case where m51 is 2, a plurality of $Cy^{51}$'s may be the same as or different from each other; and in a case where m52 is 2, a plurality of $Cy^{52}$'s may be the same as or different from each other.

$Ar^{53}$ represents any of aromatic rings selected from the group consisting of the above-mentioned groups represented by Formulae (Ar-1) to (Ar-7).

In Formula (V), examples of $P^{51}$ and $P^{52}$ include the same ones as those described for $P^{11}$ and $P^{12}$ in Formula (I), respectively, and suitable aspects thereof are also the same.

In addition, examples of $Sp^{51}$ and $Sp^{52}$ include the same ones as those described for $Sp^{11}$ and $Sp^{12}$ in Formula (I), respectively, and suitable aspects thereof are also the same.

Further, examples of n51, m51, m52, and n52 include the same ones as those described for n11, m11, m12 and n12 in Formula (I), respectively, and suitable aspects thereof are also the same.

In addition, examples of k51 include the same ones as those described for k11 in Formula (I), and suitable aspects thereof are also the same.

Furthermore, examples of $X^{51}$, $X^{52}$, $X^{53}$, $X^{54}$, $X^{55}$, and $X^{56}$ include the same ones as those described in $X^{11}$, $X^{12}$, $X^{13}$, $X^{14}$, $X^{15}$, and $X^{16}$ in Formula (I), respectively, and suitable aspects thereof are also the same.

Moreover, examples of $Ar^{51}$ and $Ar^{52}$ each include the same ones as those described in $Ar^{11}$ and $Ar^{12}$ in Formula (I), respectively, and suitable aspects thereof are also the same.

Moreover, examples of $Cy^{51}$ and $Cy^{52}$ include the same ones as those described in $Cy^{11}$ and $Cy^{12}$ in Formula (I), respectively, and suitable aspects thereof are also the same.

Examples of the compound represented by Formula (V) include the compounds represented by General Formula (1) described in JP2010-084032A (in particular, the compounds described in paragraph Nos. [0067] to [0073]), the compound represented by General Formula (II) described in JP2016-053709A (in particular, the compounds described in paragraph Nos. [0036] to [0043]), and the compounds represented by General Formula (I) described in JP2016-081035A (in particular, the compounds described in paragraph Nos. [0043] to [0055]).

Moreover, suitable examples of the compound represented by Formula (V) include compounds represented by Formulae (1) to (22), and specific examples thereof include the compounds having side chain structures shown in Tables 1 to 3 below as K (side chain structure) in Formulae (1) to (22).

Furthermore, in Tables 1 to 3 below, "*" shown in the side chain structure of K represents a bonding position to an aromatic ring.

In addition, in the side chain structures shown in 2-2 in Table 2 below and 3-2 in Table 3 below, a group adjacent to each of the acryloyloxy group and the methacryloyl group represents a propylene group (a group in which a methyl group is substituted with an ethylene group), and represents a mixture of regioisomers in which the positions of the methyl groups are different.

(1)

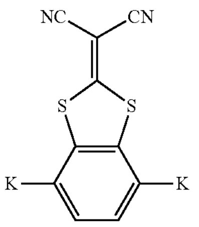

-continued (2)

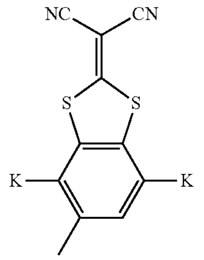

(3)

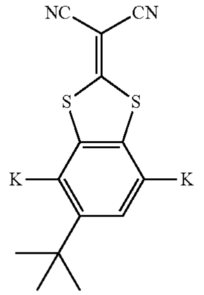

(4)

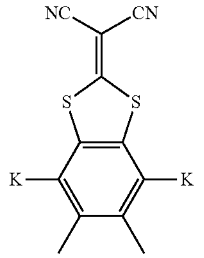

(5)

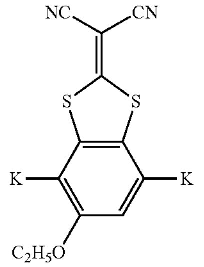

(6)

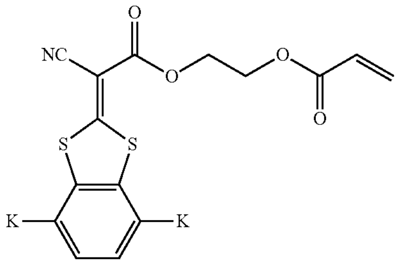

-continued
(7)
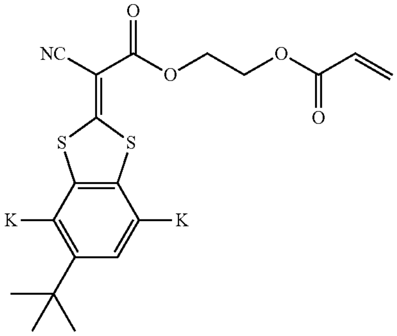
(8)
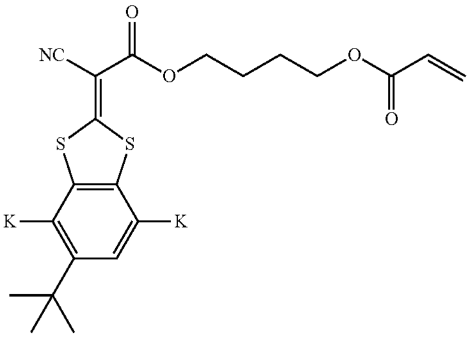
(9)
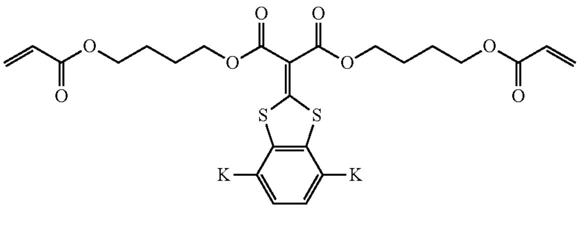
(10)
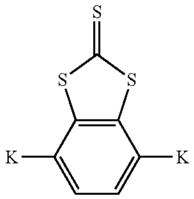
(11)
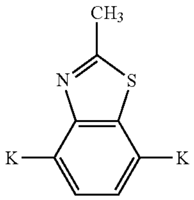
-continued
(12)
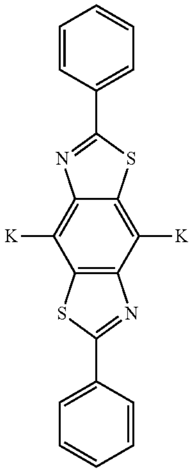
(13)
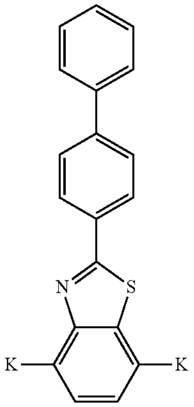
(14)
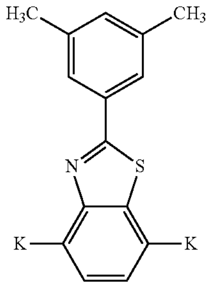
(15)
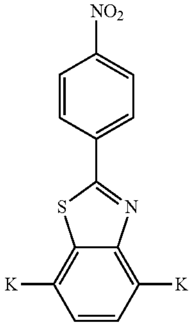

-continued
(16)
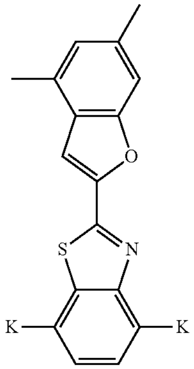
(17)
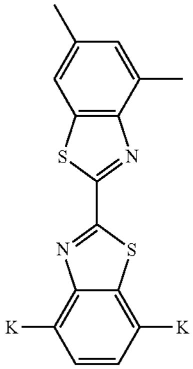
(18)
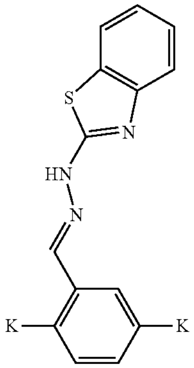
(19)
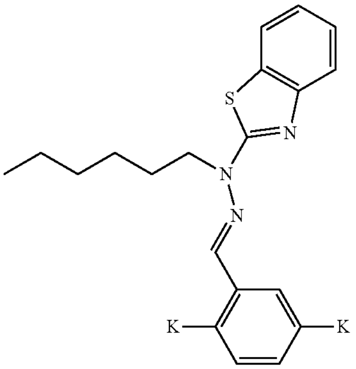
-continued
(20)
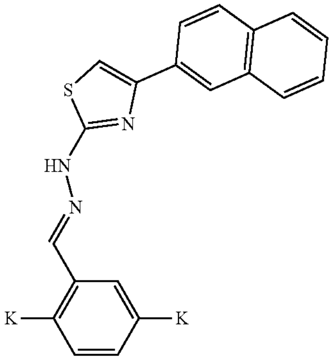
(21)
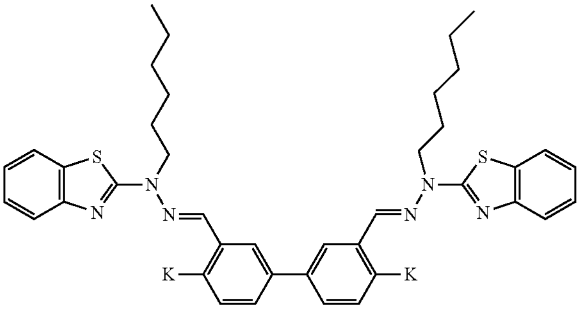
(22)
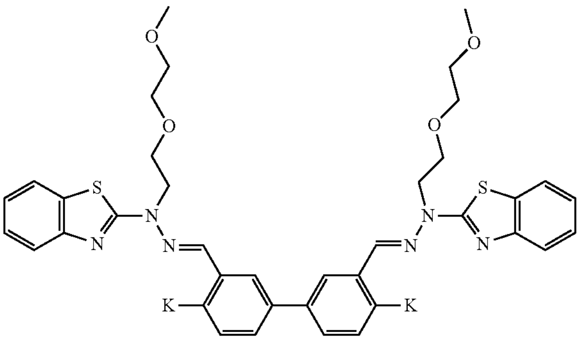

TABLE 1
| K (side chain structure) | |
|---|---|
| 1-1 | 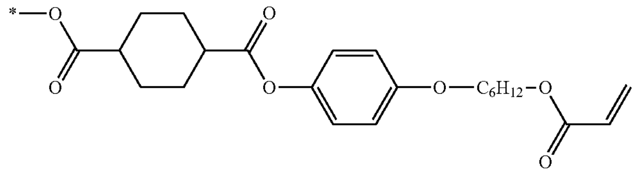 |
| 1-2 | 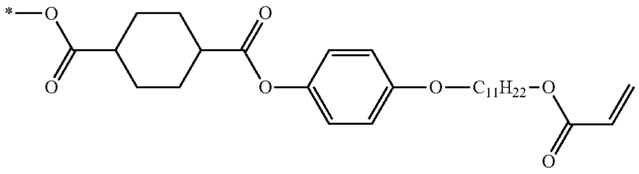 |
| 1-3 | 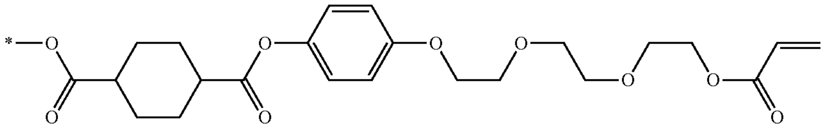 [SMILES: *OC(=O)C1CCC(C(=O)Oc2ccc(OCCOCCOCCOC(=O)C=C)cc2)CC1] |
| 1-4 | 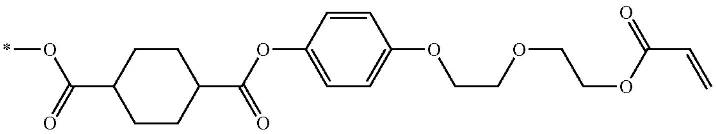 [SMILES: *OC(=O)C1CCC(C(=O)Oc2ccc(OCCOCCOC(=O)C=C)cc2)CC1] |
| 1-5 | 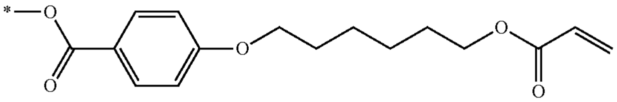 [SMILES: *OC(=O)c1ccc(OCCCCCCOC(=O)C=C)cc1] |
| 1-6 | 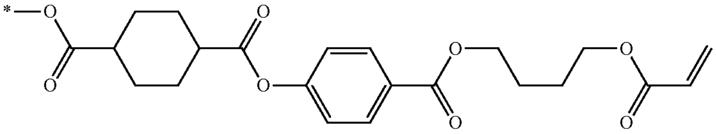 [SMILES: *OC(=O)C1CCC(C(=O)Oc2ccc(C(=O)OCCCCOC(=O)C=C)cc2)CC1] |
TABLE 2
| K (side chain structure) | |
|---|---|
| 2-1 | 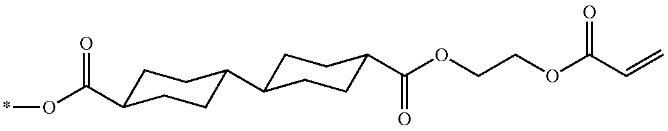 [SMILES: *OC(=O)C1CCC(C2CCC(C(=O)OCCOC(=O)C=C)CC2)CC1] |
| 2-2 | 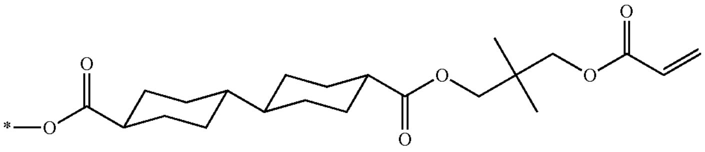 [SMILES: *OC(=O)C1CCC(C2CCC(C(=O)OCC(C)(C)COC(=O)C=C)CC2)CC1] |
| 2-3 | 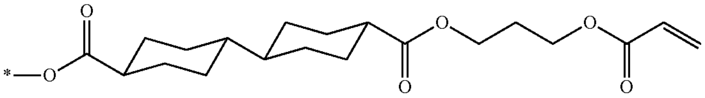 [SMILES: *OC(=O)C1CCC(C2CCC(C(=O)OCCCOC(=O)C=C)CC2)CC1] |

TABLE 2-continued
| | K (side chain structure) |
|---|---|
| 2-4 | 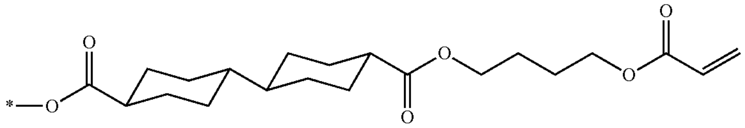 [SMILES: *OC(=O)C1CCC(C2CCC(C(=O)OCCCCOC(=O)C=C)CC2)CC1] |
| 2-5 | 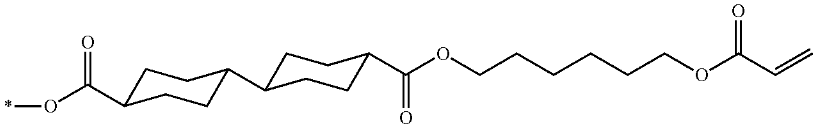 [SMILES: *OC(=O)C1CCC(C2CCC(C(=O)OCCCCCCOC(=O)C=C)CC2)CC1] |
| 2-6 | 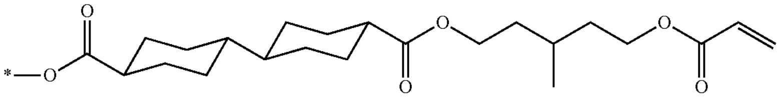 [SMILES: *OC(=O)C1CCC(C2CCC(C(=O)OCCC(C)CCOC(=O)C=C)CC2)CC1] |
| 2-7 | 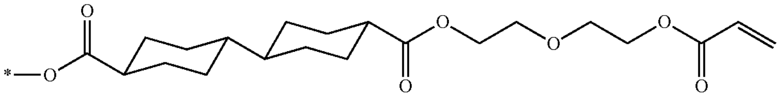 [SMILES: *OC(=O)C1CCC(C2CCC(C(=O)OCCOCCOC(=O)C=C)CC2)CC1] |
| 2-8 | 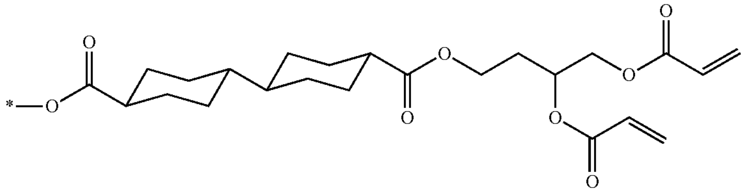 [SMILES: *OC(=O)C1CCC(C2CCC(C(=O)OCCC(COC(=O)C=C)OC(=O)C=C)CC2)CC1] |
| 2-9 | 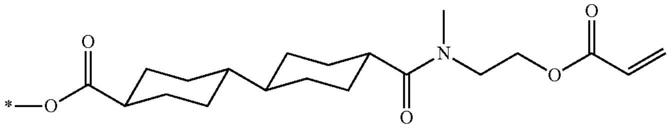 [SMILES: *OC(=O)C1CCC(C2CCC(C(=O)N(C)CCOC(=O)C=C)CC2)CC1] |
| 2-10 | 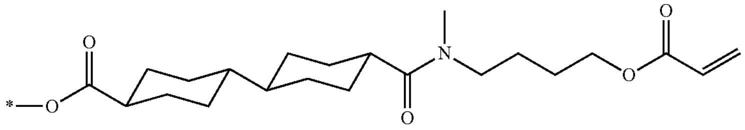 [SMILES: *OC(=O)C1CCC(C2CCC(C(=O)N(C)CCCCOC(=O)C=C)CC2)CC1] |
| 2-11 | 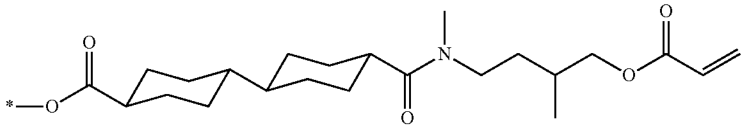 [SMILES: *OC(=O)C1CCC(C2CCC(C(=O)N(C)CCC(C)COC(=O)C=C)CC2)CC1] |
| 2-12 | 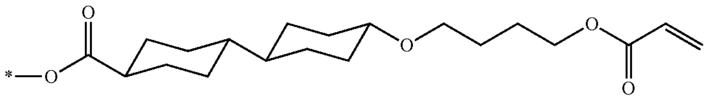 [SMILES: *OC(=O)C1CCC(C2CCC(OCCCCOC(=O)C=C)CC2)CC1] |
| 2-13 | 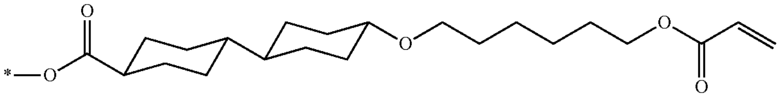 [SMILES: *OC(=O)C1CCC(C2CCC(OCCCCCCOC(=O)C=C)CC2)CC1] |
| 2-14 | 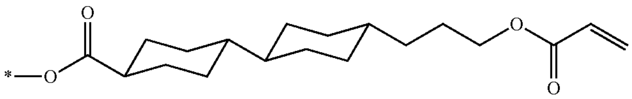 [SMILES: *OC(=O)C1CCC(C2CCC(CCCOC(=O)C=C)CC2)CC1] |

TABLE 3
| | K (side chain structure) |
|---|---|
| 3-1 | 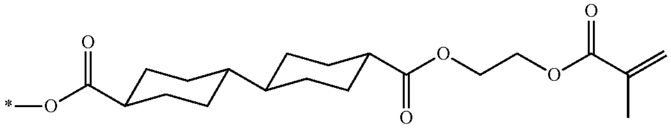 [SMILES: *OC(=O)C1CCC(C2CCC(C(=O)OCCOC(=O)C(=C)C)CC2)CC1] |
| 3-2 | 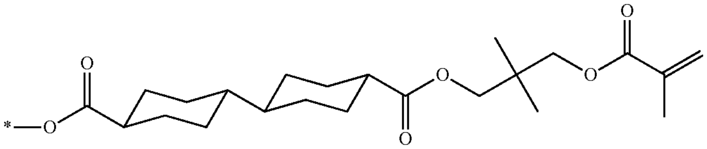 [SMILES: *OC(=O)C1CCC(C2CCC(C(=O)OCC(C)(C)COC(=O)C(=C)C)CC2)CC1] |
| 3-3 | 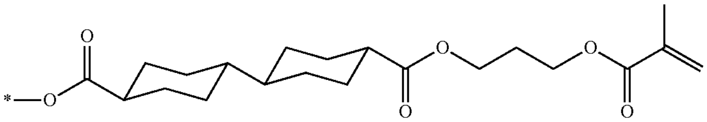 [SMILES: *OC(=O)C1CCC(C2CCC(C(=O)OCCCOC(=O)C(=C)C)CC2)CC1] |
| 3-4 | 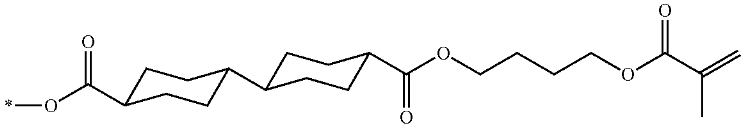 [SMILES: *OC(=O)C1CCC(C2CCC(C(=O)OCCCCOC(=O)C(=C)C)CC2)CC1] |
| 3-5 | 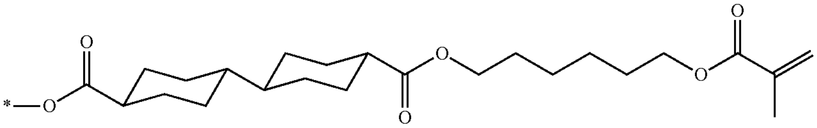 [SMILES: *OC(=O)C1CCC(C2CCC(C(=O)OCCCCCCOC(=O)C(=C)C)CC2)CC1] |
| 3-6 | 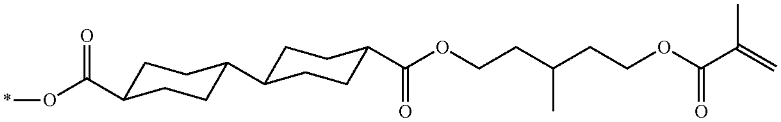 [SMILES: *OC(=O)C1CCC(C2CCC(C(=O)OCCC(C)CCOC(=O)C(=C)C)CC2)CC1] |
| 3-7 | 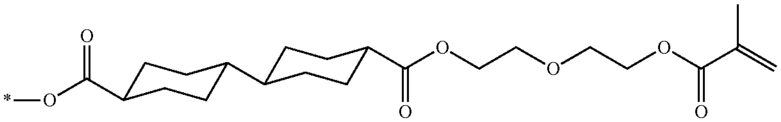 [SMILES: *OC(=O)C1CCC(C2CCC(C(=O)OCCOCCOC(=O)C(=C)C)CC2)CC1] |
| 3-8 | 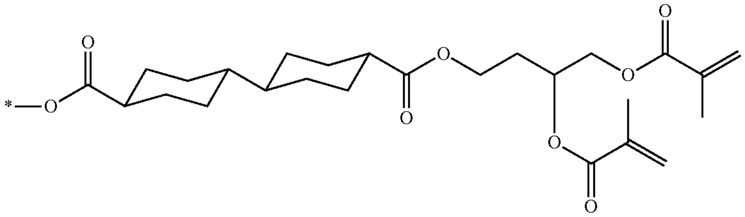 [SMILES: *OC(=O)C1CCC(C2CCC(C(=O)OCCC(COC(=O)C(=C)C)OC(=O)C(=C)C)CC2)CC1] |
| 3-9 | 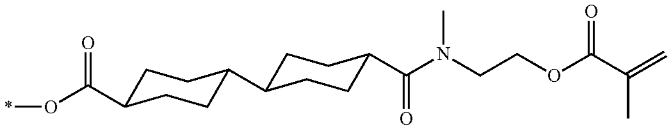 [SMILES: *OC(=O)C1CCC(C2CCC(C(=O)N(C)CCOC(=O)C(=C)C)CC2)CC1] |
| 3-10 | 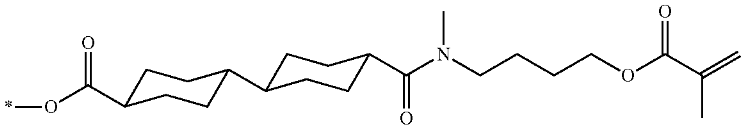 [SMILES: *OC(=O)C1CCC(C2CCC(C(=O)N(C)CCCCOC(=O)C(=C)C)CC2)CC1] |

TABLE 3-continued

| | K (side chain structure) |
|---|---|
| 3-11 | 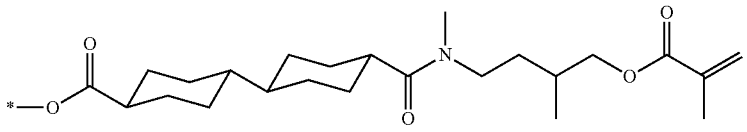 [SMILES: *OC(=O)C1CCC(C2CCC(C(=O)N(C)CCC(C)COC(=O)C(=C)C)CC2)CC1] |
| 3-12 | 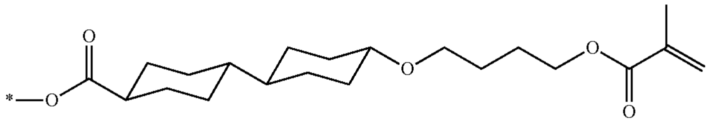 [SMILES: *OC(=O)C1CCC(C2CCC(OCCCCOC(=O)C(=C)C)CC2)CC1] |
| 3-13 | 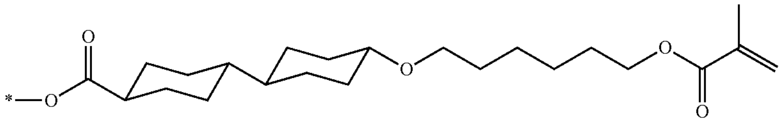 [SMILES: *OC(=O)C1CCC(C2CCC(OCCCCCCOC(=O)C(=C)C)CC2)CC1] |
| 3-14 | 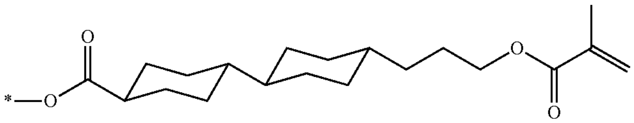 [SMILES: *OC(=O)C1CCC(C2CCC(CCCOC(=O)C(=C)C)CC2)CC1] |

In a case where the polymerizable liquid crystal composition of the embodiment of the present invention contains the above-mentioned reverse wavelength dispersion liquid crystal compound, a content of the reverse wavelength dispersion liquid crystal compound is preferably 20% to 90% by mass, and more preferably 30% to 80% by mass with respect to a total mass of the forward wavelength dispersion liquid crystal compound A, the forward wavelength dispersion liquid crystal compound B, and the reverse wavelength dispersion liquid crystal compound.

[Polymerization Initiator]

The polymerizable liquid crystal composition of the embodiment of the present invention preferably includes a polymerization initiator.

As the polymerization initiator, a photopolymerization initiator capable of initiating a polymerization reaction upon irradiation with ultraviolet rays is preferable.

Examples of the photopolymerization initiator include α-carbonyl compounds (described in each of U.S. Pat. Nos. 2,367,661A and 2,367,670A), acyloin ethers (described in U.S. Pat. Nos. 2,448,828A), α-hydrocarbon-substituted aromatic acyloin compounds (described in U.S. Pat. Nos. 2,722,512A), multinuclear quinone compounds (described in each of U.S. Pat. Nos. 3,046,127A and 2,951,758A), combinations of a triarylimidazole dimer and a p-aminophenyl ketone (described in U.S. Pat. Nos. 3,549,367A), acridine and phenazine compounds (described in JP1985-105667A (JP-S60-105667A) and U.S. Pat. Nos. 4,239,850A), oxadiazole compounds (described in U.S. Pat. Nos. 4,212,970A), and acyl phosphine oxide compounds (described in JP1988-40799B (JP-S63-40799B), JP1993-29234B (JP-H05-29234B), JP1998-95788A (JP-H10-95788A), and JP1998-29997A, (JP-H10-29997A)).

As the polymerization initiator, an oxime type polymerization initiator is also preferable. Specific examples thereof include the initiators described in paragraphs [0049] to [0052] of WO2017/170443A.

[Solvent]

It is preferable that the polymerizable liquid crystal composition of the embodiment of the present invention includes a solvent from the viewpoints of the workability in formation of an optically anisotropic layer, for example.

Examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide). The solvents may be used singly or in combination of two or more kinds thereof.

[Leveling Agent]

It is preferable that the polymerizable liquid crystal composition includes a leveling agent from the viewpoint that a surface of the optically anisotropic layer of the embodiment of the present invention is maintained smooth and the alignment is easily controlled.

Such a leveling agent is preferably a fluorine-based leveling agent or a silicon-based leveling agent for a reason that it has a high leveling effect on the addition amount, and the leveling agent is more preferably a fluorine-based leveling agent from the viewpoint that it is less likely to cause bleeding (bloom or bleed).

Examples of the leveling agent include the compounds described in paragraphs [0079] to [0102] of JP2007-069471A, the compound represented by General Formula (I) described in JP2013-047204A (in particular, the compounds described in paragraphs [0020] to [0032]), the compound represented by General Formula (I) described in JP2012-211306A (in particular, the compounds described in paragraphs [0022] to [0029]), the liquid crystal alignment accelerator represented by General Formula (I) described in JP2002-129162A (in particular, the compounds described in paragraphs [0076] to [0078] and [0082] to [0084]), and the compounds represented by General Formulae (I), (II), and (III) described in JP2005-099248A (in particular, the compounds described in paragraphs [0092] to [0096]). Furthermore, the leveling agent may also function as an alignment control agent which will be described later.

[Alignment Control Agent]

The polymerizable liquid crystal composition of the embodiment of the present invention may include an alignment control agent as necessary.

With the alignment control agent, various alignment states such as homeotropic alignment (vertical alignment), tilt alignment, hybrid alignment, and cholesteric alignment can be thrilled, in addition to the homogeneous alignment, and specific alignment states can be controlled and achieved more uniformly and more accurately.

As an alignment control agent which accelerates the homogeneous alignment, for example, a low-molecular-weight alignment control agent and a high-molecular-weight alignment control agent can be used.

With regard to the low-molecular-weight alignment control agent, reference can be made to the description in, for example, paragraphs [0009] to [0083] of JP2002-20363A, paragraphs [0111] to [0120] of JP2006-106662A, and paragraphs [0021] to [0029] of JP2012-211306A, the contents of which are hereby incorporated by reference.

In addition, with regard to the high-molecular-weight alignment control agent, reference can be made to the description in, for example, paragraphs [0021] to [0057] of JP2004-198511A and paragraphs [0121] to [0167] of JP2006-106662A, the contents of which are hereby incorporated by reference.

Moreover, examples of an alignment control agent which forms or accelerates a homeotropic alignment include a boronic acid compound and an onium salt compound. With regard to the alignment control agent, reference can be made to the description in the compounds described in paragraphs [0023] to [0032] of JP2008-225281A, paragraphs [0052] to [0058] of JP2012-208397A, paragraphs [0024] to [0055] of JP2008-026730A, and paragraphs [0043] to [0055] of JP2016-193869A, the contents of which are hereby incorporated by reference.

On the other hand, the cholesteric alignment can be achieved by adding a chiral agent to the polymerizable liquid crystal composition of the embodiment of the present invention, and it is possible to control the direction of revolution of the cholesteric alignment by its chiral direction.

Incidentally, the pitch of the cholesteric alignment in accordance with the alignment regulating force of the chiral agent may be controlled.

In a case where the polymerizable liquid crystal composition of the embodiment of the present invention includes an alignment control agent, a content thereof is preferably 0.01% to 10% by mass, and more preferably 0.05% to 5% by mass with respect to the mass of the total solid content of the composition. In a case where the content is within the range, it is possible to obtain a uniform and highly transparent cured product, in which precipitation or phase separation, alignment defects, and the like are suppressed while a desired alignment state is achieved.

[Other Components]

The polymerizable liquid crystal composition of the embodiment of the present invention may include components other than the above-mentioned components. Examples of such other components include a liquid crystal compound other than the above-mentioned forward wavelength dispersion liquid crystal compound A, forward wavelength dispersion liquid crystal compound B, and reverse wavelength dispersion liquid crystal compound (for example, a monofunctional compound having one polymerizable group), a surfactant, a tilt angle control agent, an alignment assistant, a plasticizer, and a crosslinking agent.

[Optically Anisotropic Layer]

An optically anisotropic layer of an embodiment of the present invention is an optically anisotropic layer obtained by immobilizing the alignment state of the above-mentioned polymerizable liquid crystal composition of the embodiment of the present invention.

Examples of a method for forming the optically anisotropic layer include a method in which the above-mentioned polymerizable liquid crystal composition of the embodiment of the present invention is used to cause a desired alignment state, which is then immobilized by polymerization.

Here, the polymerization conditions are not particularly limited, but in the polymerization by irradiation with light, ultraviolet rays are preferably used. The irradiation dose is preferably 10 $mJ/cm^2$ to 50 $J/cm^2$, more preferably 20 $mJ/cm^2$ to 5 $J/cm^2$, still more preferably 30 $mJ/cm^2$ to 3 $J/cm^2$, and particularly preferably 50 $mJ/cm^2$ to 1,000 $mJ/cm^2$. In addition, the polymerization may be carried out under a heating condition in order to accelerate the polymerization reaction.

In addition, the optically anisotropic layer can be formed on any of supports or alignment films in the optical film which will be described later or a polarizer in the polarizing plate which will be described later.

The optically anisotropic layer of the embodiment of the present invention preferably shows a diffraction peak derived from a periodic structure in X-ray diffraction measurement.

Here, suitable examples of an aspect exhibiting the above-mentioned diffraction peak include an aspect in which molecules adjacent in the direction vertical to the alignment axis form a layer and this layer is laminated in the direction parallel to the alignment axis, that is, an aspect exhibiting a smectic phase. Furthermore, from the viewpoint that the smectic phase is easily expressed, it is preferable that the polymerizable liquid crystal compound is a compound exhibiting a smectic phase in any of a case where the temperature is elevated and a case where the temperature is lowered.

In addition, whether or not the above-mentioned diffraction peak is exhibited can also be confirmed by observing a texture characteristic of a liquid crystal phase having a periodic structure with a polarizing microscope.

The alignment state of the forward wavelength dispersion liquid crystal compound A and the forward wavelength dispersion liquid crystal compound B (hereinafter each simply referred to as a "polymerizable liquid crystal compound" in this paragraph) in the optically anisotropic layer of the embodiment of the present invention may be any of horizontal alignment, vertical alignment, tilt alignment, and twist alignment, and it is preferable that the polymerizable liquid crystal compound is immobilized in a state of being horizontally aligned with respect to a main surface of the optically anisotropic layer.

In addition, in the present specification, the "horizontal alignment" means that the main surface of an optically anisotropic layer (or in a case where the optically anisotropic layer is formed on a member such as a support and an alignment film, a surface of the member) and the major axis direction of the polymerizable liquid crystal compound are parallel. Incidentally, it is not required for the both to be strictly parallel, and in the present specification, the expression means that the both are aligned at an angle formed by the major axis direction of the polymerizable liquid crystal compound and the main surface of the optically anisotropic layer of less than 10°.

In the optically anisotropic layer, the angle formed by the major axis direction of the polymerizable liquid crystal compound and the main surface of the optically anisotropic layer is preferably 0° to 5°, more preferably 0° to 3°, and still more preferably 0° to 2°.

The optically anisotropic layer of the embodiment of the present invention preferably satisfies Expression (VI).

$$1.00 < Re(450)/Re(550) \quad (VI)$$

Here, in Formula (VI), Re(450) represents an in-plane retardation at a wavelength of 450 nm of the optically anisotropic layer, and Re(550) represents an in-plane retardation at a wavelength of 550 nm of the optically anisotropic layer. In addition, in the present specification, in a ease where the measurement wavelength of the retardation is not specified, the measurement wavelength is 550 nm.

Furthermore, the values of the in-plane retardation (Re) and the thickness-direction retardation (Rth) refer to values measured with light at the measurement wavelength using AxoScan OPMF-1 (manufactured by Opto Science, Inc.).

Specifically, by inputting the average refractive index ((Nx+Ny+Nz)/3) and the film thickness (d(μm)) to AxoScan OPMF-1, it is possible to calculate:

Slow axis direction)(°)

Re(λ)=R0(λ)

Rth(λ)=((nx+ny)/2−nz)×d.

Moreover, R0(λ) is expressed in a numerical value calculated with AxoScan OPMF-1, but means Re(λ).

In addition, the optically anisotropic layer of the embodiment of the present invention is preferably a positive A-plate or a positive C-plate, and more preferably the positive A-plate.

Here, the positive A-plate (A-plate which is positive) and the positive C-plate (C-plate which is positive) are defined as follows.

In a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz, the positive A-plate satisfies the relationship of Expression (A1) and the positive C-plate satisfies the relationship of Expression (C1). In addition, the positive A-plate has an Rth showing a positive value and the positive C-plate has an Rth showing a negative value.

$$nx > ny \approx nz \quad \text{Expression (A1)}$$

$$nz > nx \approx ny \quad \text{Expression (C1)}$$

Furthermore, the symbol, "≈", encompasses not only a case where the both sides are completely the same as each other but also a case where the both are substantially the same as each other.

In the expression, "substantially the same", with regard to the positive A-plate, for example, a ease where (ny−nz)×d (in which d is the thickness of a film) is −10 to 10 nm, and preferably −5 to 5 nm is also included in "ny≈nz", and a case where (nx−nz)×d is −10 to 10 nm, and preferably −5 to 5 nm is also included in "nx≈nz". In addition, with regard to the positive C-plate, for example, a case where (nx−ny)×d (in which d is the thickness of a film) is 0 to 10 nm, and preferably 0 to 5 am is also included in "nx≈ny".

In a case where the optically anisotropic layer of the embodiment of the present invention is a positive A-plate, the Re(550) is preferably 100 to 180 nm, more preferably 120 to 160 nm, still more preferably 130 to 150 nm, and particularly preferably 130 to 140 nm, from the viewpoint that the optically anisotropic layer functions as a λ/4 plate.

Here, the "λ/4 plate" is a plate having a function, specifically, a plate having a function of converting a linearly polarized light at a certain specific wavelength into a circularly polarized light (or converting a circularly polarized light to a linearly polarized light).

[Optical Film]

The optical film of an embodiment of the present invention is an optical film having the optically anisotropic layer of the embodiment of the present invention.

The structure of the optical film will be described with reference to FIG. 1. FIG. 1 is a schematic cross-sectional view showing an example of the optical film.

Furthermore, FIG. 1 is a schematic view, and the thicknesses relationship, the positional relationship, and the like among the respective layers are not necessarily consistent with actual ones, and either of the support shown in FIG. 1 and an alignment film are optional constitutional members.

An optical film 10 shown in FIG. 1 has a support 16, an alignment film 14, and an optically anisotropic layer 12 as the cured product of the polymerizable liquid crystal composition of the embodiment of the present invention in this order.

In addition, the optically anisotropic layer 12 may be a laminate of two or more different optically anisotropic layers. For example, in a case where the polarizing plate of the embodiment of the present invention which will be described later is used as a circularly polarizing plate or in a case where the optical film of the embodiment of the present invention is used as an optical compensation film for an IPS mode or an FFS mode liquid crystal display device, the optically anisotropic layer 12 is preferably a laminate of a positive A-plate and a positive C-plate.

In addition, the optically anisotropic layer may be peeled from the support, and the optically anisotropic layer may be used alone as an optical film.

Hereinafter, various members used for the optical film will be described in detail.

[Optically Anisotropic Layer]

An optically anisotropic layer contained in the optical film of the embodiment of the present invention is the above-mentioned optically anisotropic layer of the embodiment of the present invention.

In the optical film, a thickness of the optically anisotropic layer is not particularly limited, but is preferably 0.1 to 10 μm, and more preferably 0.5 to 5 μm.

[Support]

The optical film may have a support as a base material for forming an optically anisotropic layer as described above.

Such a support is preferably transparent. Specifically, the light transmittance is preferably 80% or more.

Examples of such a support include a glass substrate and a polymer film. Examples of the material for the polymer film include cellulose-based polymers; acrylic polymers having an acrylic ester polymer such as polymethyl methacrylate and a lactone ring-containing polymer; thermoplastic norbornene-based polymers; polycarbonate-based polymers; polyester-based polymers such as polyethylene terephthalate and polyethylene naphtholate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

In addition, an aspect in which a polarizer which will be described later may also function as such a support is also available.

A thickness of the support is not particularly limited, but is preferably 5 to 60 μm, and more preferably 5 to 40 μm.

[Alignment Film]

In the optical film, the optically anisotropic layer is preferably formed on the surface of an alignment film. In a case where the optical film has any of the above-mentioned supports, the alignment film may be sandwiched between the support and the optically anisotropic layer. In addition, an aspect in which the above-mentioned support may also function as an alignment film is also available.

The alignment film may be any film as long as it has a function of horizontally aligning the polymerizable liquid crystal compound included in the composition.

The alignment film generally has a polymer as a main component. Polymer materials for the alignment film are described in many documents, and many commercially available products thereof can be used.

As the polymer material for the alignment film, a polyvinyl alcohol, a polyimide, or a derivative thereof is preferable, and a modified or unmodified polyvinyl alcohol is more preferable.

Examples of the alignment film which may be contained in the optical film include the alignment films described for Line 24 on Page 43 to Line 8 on Page 49 of WO01/88574A; the alignment films consisting of modified polyvinyl alcohols described in paragraphs [0071] to [0095] of JP3907735B; and the liquid crystal alignment film formed by a liquid crystal alignment agent described in JP2012-155308A.

Since an object does not come into contact with a surface of the alignment film upon formation of the alignment film and the deterioration of a surface condition can be prevented, it is preferable to use a photo-alignment film as the alignment film.

The photo-alignment film is not particularly limited, but an alignment film formed by the polymer material such as a polyamide compound and a polyimide compound described in paragraphs [0024] to [0043] of WO2005/096041A; a liquid crystal alignment film formed by the liquid crystal alignment agent having a photo-alignment group described in JP2012-155308A; LLP-JP265CP, trade name, manufactured by Rolic Technologies Ltd.; or the like can be used.

A thickness of the alignment film is not particularly limited, but from the viewpoint of forming an optically anisotropic layer having a uniform film thickness h mitigating the surface roughness that can be present on the support, the thickness is preferably 0.01 to 10 μm, more preferably 0.01 to 1 μm, and still more preferably 0.01 to 0.5 μm.

[Ultraviolet Absorber]

The optical film preferably includes an ultraviolet (UV) absorber, taking an effect of external light (particularly ultraviolet rays) into consideration.

The ultraviolet absorber may be included in the optically anisotropic layer or may also be included in a member other than the optically anisotropic layer, constituting the optical film. Suitable examples of the member other than the optically anisotropic layer include a support.

As the ultraviolet absorber, any one of ultraviolet absorbers known in the related art, which can express ultraviolet absorptivity, can be used. Among such the ultraviolet absorbers, a benzotriazole-based or hydroxyphenyltriazine-based ultraviolet absorber is preferable from the viewpoint that it has high ultraviolet absorptivity and ultraviolet absorbing ability (ultraviolet-shielding ability) used for an image display device is obtained.

In addition, in order to broaden ultraviolet absorbing ranges, two or more kinds of ultraviolet absorbers having different maximum absorption wavelengths are also preferably used in combination.

Examples of the ultraviolet absorber include the compounds described in paragraphs [0258] and [0259] of JP2012-18395A and the compounds described in paragraphs [0055] to [0105] of JP2007-72163A.

In addition, as a commercially available product thereof, for example, Tinuvin 400, Tinuvin 405, Tinuvin 460, Tinuvin 477, Tinuvin 479, and Tinuvin 1577 (all manufactured by BASF), or the like can be used.

[Polarizing Plate]

The polarizing plate of an embodiment of the present invention has the above-mentioned optical film of the embodiment of the present invention and a polarizer.

In a case where the above-mentioned optically anisotropic layer is a λ/4 plate (positive A-plate), the polarizing plate can be used as a circularly polarizing plate.

In a case where the polarizing plate is used as a circularly polarizing plate, the above-mentioned optically anisotropic layer is used as a λ/4 plate (positive A-plate), and an angle between the slow axis of the λ/4 plate and the absorption axis of a polarizer which will be described later is preferably 30° to 60°, more preferably 40° to 50°, still more preferably 42° to 48°, and particularly preferably 45°.

Here, the "slow axis" of the λ/4 plate means a direction in which the refractive index in the plane of the λ/4 plate is maximum, and the "absorption axis" of the polarizer means a direction in which the absorbance is highest.

In addition, the polarizing plate can also be used as an optical compensation film for an IPS mode or FFS mode liquid crystal display device.

In a case where the polarizing plate is used as an optical compensation film for an IPS mode or FFS mode liquid crystal display device, it is preferable that the above-mentioned optically anisotropic layer is used as at least one plate of a laminate of a positive A-plate and a positive C-plate, an angle formed by the slow axis of the positive A-plate layer and the absorption axis of a polarizer which will be described later are orthogonal or parallel, and specifically, it is more preferable that an angle formed by the slow axis of the positive A-plate layer and the absorption axis of the polarizer which will be described later is 0° to 5° or 85° to 95°.

In a case where the polarizing plate of the embodiment of the present invention is used in a liquid crystal display device which will be described later, it is preferable that an angle formed by the slow axis of the optically anisotropic layer and the absorption axis of a polarizer which will be described later is parallel or orthogonal.

In addition, in the present specification, a term "parallel" does not require that the both are strictly parallel, but means that an angle between one and the other is less than 10°. In addition, in the present specification, a term "orthogonal" does not require that the both are strictly orthogonal, but means that the angle between one and the other is more than 80° and less than 100°.

[Polarizer]

The polarizer contained in the polarizing plate is not particularly limited as long as it is a member having a function of converting light into specific linearly polarized light, and art absorptive type polarizer and a reflective type polarizer, which are known in the related art, can be used.

An iodine-based polarizer, a dye-based polarizer using a dichroic dye, a polyene-based polarizer, or the like is used as the absorptive type polarizer. The iodine-based polarizer and the dye-based polarizer are classified into a coating type polarizer and a stretching type polarizer, any of which can be applied, but a polarizer which is manufactured by allowing polyvinyl alcohol to adsorb iodine or a dichroic dye and performing stretching is preferable.

In addition, examples of a method of obtaining a polarizer by carrying out stretching and dying in a state of a laminated film in which a polyvinyl alcohol layer is formed on a base material include the methods disclosed in JP5048120B, JP514391.8B, JP4691205B, JP4751481B, and JP4751486B, and known technologies relating to these polarizers can also be preferably used.

Examples of the coating type polarizer include those in WO2018/124198A, WO2018/186503A, WO2019/132020A, WO2019/132018A, WO2019/189345A, JP2019-197168A, JP2019-194685A, and JP2019-139222A, and known techniques relating to these polarizers can also be preferably used.

A polarizer in which thin films having different birefringence are laminated, a wire grid-type polarizer, a polarizer having a combination of a cholesteric liquid crystal having a selective reflection range, a ¼ wavelength plate, and the like is used as the reflective type polarizer.

Among those, a polarizer including a polyvinyl alcohol-based resin (a polymer including $—CH_2—CHOH—$ as a repeating unit, in particular, at least one selected from the group consisting of a polyvinyl alcohol and an ethylene-vinyl alcohol copolymer) is preferable from the viewpoint that the adhesiveness is more excellent.

In addition, from the viewpoint of imparting crack resistance, the polarizer may have a depolarization unit formed along the opposite end edges. Examples of the depolarization unit include JP2014-240970A.

In addition, the polarizer may have non-polarizing parts arranged at predetermined intervals in the longitudinal direction and/or the width direction. The non-polarizing part is a decolorized part which is partially decolorized. The arrangement pattern of the non-polarizing parts can be appropriately set according to a purpose. For example, the non-polarizing parts are arranged at a position corresponding to a camera unit of an image display device in a case where a polarizer is cut (cut, punched, or the like) to a predetermined size in order to be attached to the image display device in a predetermined size. Examples of the arrangement pattern of the non-polarizing parts include those in JP2016-27392A.

A thickness of the polarizer is not particularly limited, but is preferably 3 to 60 μm, more preferably 3 to 30 μm, and still more preferably 3 to 10 μm.

[Pressure-Sensitive Adhesive Layer]

The polarizing plate may have a pressure-sensitive adhesive layer arranged between the optically anisotropic layer in the optical film and the polarizer.

Examples of a material forming the pressure-sensitive adhesive layer used for lamination of the cured product and the polarizer include a member formed of a substance in which a ratio ($\tan \delta = G''/G'$) between a storage elastic modulus $G'$ and a loss elastic modulus $G''$, each measured with a dynamic viscoelastometer, is 0.001 to 1.5, in which a so-called pressure-sensitive adhesive and a readily creepable substance are included. Examples of the pressure-sensitive adhesive include a polyvinyl alcohol-based pressure-sensitive adhesive, but the pressure-sensitive adhesive is not limited thereto.

[Adhesive Layer]

In the polarizing plate, an adhesive layer may be arranged between the optically anisotropic layer in the optical film and the polarizer.

As the adhesive layer used for laminating a cured product and a polarizer, a curable adhesive composition that is cured by irradiation with active energy rays or heating is preferable.

Examples of the curable adhesive composition include a curable adhesive composition containing a cationically polymerizable compound and a curable adhesive composition containing a radically polymerizable compound.

A thickness of the adhesive layer is preferably 0.01 to 20 μm, more preferably 0.01 to 10 μm, and still more preferably 0.05 to 5 μm. In a case where the thickness of the adhesive layer is within this range, floating or peeling does not occur between the protective layer or optically anisotropic layer and the polarizer, which are laminated, and a practically acceptable adhesive three cart be obtained. In addition, the thickness of the adhesive layer is preferably 0.4 μm or more from the viewpoint that the generation of air bubbles can be suppressed.

Moreover, from the viewpoint of durability, a bulk water absorption rate of the adhesive layer may be adjusted to 10% by mass or less, and is preferably 2% by mass or less. The bulk water absorption rate is measured according to the water absorption rate testing method described in JIS K 7209.

With regard to the adhesive layer reference can be made to, for example, the description in paragraphs [0062] to [0080] of JP2016-35579A, the contents of which are incorporated herein by reference.

[Easy Adhesion Layer]

In the polarizing plate, an easy adhesion layer may be arranged between the optically anisotropic layer in the optical film and the polarizer. A storage elastic modulus of the easy adhesion layer at 85° C. is preferably $1.0\times10^6$ Pa to $1.0\times10^7$ Pa from the viewpoints that the adhesiveness between the optically anisotropic layer and the polarizer is excellent and the generation of cracks in the polarizer is suppressed. Examples of the constituent material of the easy adhesion layer include a polyolefin-based component and a polyvinyl alcohol-based component. A thickness of the easy adhesion layer is preferably 500 nm to 1 μm.

With regard to the easy adhesion layer, reference can be made to, for example, the description in paragraphs [0048] to [0053] of JP2018-36345A, the contents of which are incorporated herein by reference.

[Image Display Device]

An image display device of an embodiment of the present invention is an image display device having the optical film of the embodiment of the present invention or the polarizing plate of the embodiment of the present invention.

A display element used in the image display device is not particularly limited, and examples thereof include a liquid crystal cell, an organic electroluminescent (hereinafter simply referred to as "electroluminescence (EL)") display panel, and a plasma display panel. Among those, the liquid crystal cell and the organic EL display panel are preferable, and the liquid crystal cell is more preferable.

That is, as the image display device, a liquid crystal display device using a liquid crystal cell as a display element or an organic EL display device using an organic EL display panel as a display element is preferable, and the liquid crystal display device is more preferable.

[Liquid Crystal Display Device]

A liquid crystal display device which is an example of the image display device is a liquid crystal display device having the above-mentioned polarizing plate and a liquid crystal cell.

Furthermore, it is preferable that the above-mentioned polarizing plate is used as the polarizing plate of the front side, and it is more preferable that the above-mentioned polarizing plate is used as the polarizing plates on the front and rear sides, among the polarizing plates provided on the both sides of the liquid crystal cell.

Hereinafter, the liquid crystal cell constituting the liquid crystal display device will be described in detail.

<Liquid Crystal Cell>

The liquid crystal cell used in the liquid crystal display device is a vertical alignment (VA) mode, an optically compensated bend (OCB) mode, an in-plane-switching (IPS) mode, a fringe-field-switching (FFS) mode, or a twisted nematic (TN) mode is preferred, but is not limited to these.

In a TN-mode liquid crystal cell, rod-like liquid crystal molecules are substantially horizontally aligned and are twist-aligned at 60° to 120° during no voltage application thereto. A TN-mode liquid crystal cell is most often used in a color TFT liquid crystal display device and described in numerous documents.

In a VA-mode liquid crystal cell, rod-like liquid crystal molecules are substantially vertically aligned during no voltage application thereto. Examples of the VA-mode liquid crystal cell include (1) a VA-mode liquid crystal cell in the narrow sense of the word, in which rod-like liquid crystal molecules are substantially vertically aligned during no voltage application thereto, but are substantially horizontally aligned during voltage application thereto (described in JP1990-176625A (JP-H02-176625A)), (2) an MVA-mode liquid crystal cell in which the VA-mode is multi-domained for view angle enlargement (described in SID97, Digest of tech. Papers (preprint), 28 (1997) 845), (3) a liquid crystal cell in a mode (n-ASM mode) in which rod-like liquid crystal molecules are substantially vertically aligned during no voltage application thereto and are multi-domain-aligned during voltage application thereto (described in Seminar of Liquid Crystals of Japan, Papers (preprint), 58-59 (1998)), and (4) a survival-mode liquid crystal cell ((announced in LCD International 98). In addition, the liquid crystal cell in the VA mode may be any of a patterned vertical alignment (PVA) type, an optical alignment type, and a polymer-sustained alignment (PSA) type. Details of these modes are specifically described in JP2006-215326A and JP2008-538819A.

In air IPS-mode liquid crystal cell, rod-like liquid crystal molecules are aligned substantially parallel with respect to a substrate, and application of an electric field parallel to the substrate surface causes the liquid crystal molecules to respond planarly. The IPS-mode displays black in a state where no electric field is applied and a pair of upper and lower polarizing plates have absorption axes which are orthogonal to each other. A method of improving the view angle by reducing light leakage during black display in an oblique direction using an optical compensation sheet is disclosed in JP1998-54982A (JP-H10-54982A), JP1999-202323A (JP-H11-202323A), JP1997-292522A (JP-H09-292522A), JP1999-133408A (JP-H11-133408A), JP1999-305217A (JP-H11-305217A), JP1998-307291A (JP-1110-307291A), and the like.

[Organic EL Display Device]

Examples of the organic EL display device which is an example of the image display device include an aspect which includes, from the visible side, a polarizer, a λ/4 plate (a positive A-plate) consisting of the above-mentioned optically anisotropic layer, and an organic EL display panel in this order.

In addition, the organic EL display panel is a display panel composed of an organic EL device in which an organic tight emitting layer (organic electroluminescent layer) is sandwiched between electrodes (between a cathode and an anode). The configuration of the organic EL display panel is not particularly limited but a known configuration is adopted.

EXAMPLES

Hereinbelow, the present invention will be described in more detail with reference to Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to Examples shown below.

Example 1

[Manufacture of Protective Film 1]

<Preparation of Core Layer Cellulose Acylate Dope 1>

The following composition was put into a mixing tank and stirred to dissolve the respective components to prepare a core layer cellulose acetate dope 1.

| Core layer cellulose acylate dope 1 | |
|---|---|
| Cellulose acetate having a degree of acetyl substitution of 2.88 | 100 parts by mass |
| The following polyester | 12 parts by mass |
| The following durability improver | 4 parts by mass |
| Methylene chloride (the first solvent) | 430 parts by mass |
| Methanol (the second solvent) | 64 parts by mass |

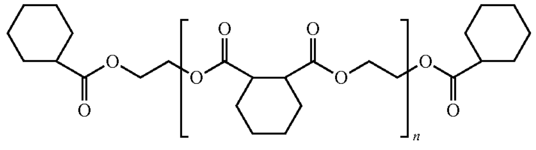

Polyester (number-average molecular weight of 800)

-continued

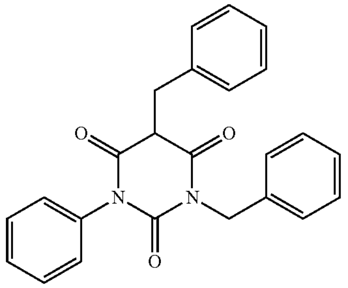

Durability improver

<Preparation of Outer Layer Cellulose Acrylate Dope 1>

10 parts by mass of the following matting agent dispersion liquid 1 was added to 90 parts by mass of the core layer cellulose acylate dope 1 to prepare an outer layer cellulose acylate dope 1.

| Matting agent dispersion liquid 1 | |
|---|---|
| Silica particles with an average particle size of 20 nm (AEROSIL R972, manufactured by Nippon Aerosil Co., Ltd.) | 2 parts by mass |
| Methylene chloride (the first solvent) | 76 parts by mass |
| Methanol (the second solvent) | 11 parts by mass |
| Core layer cellulose acylate dope 1 | 1 part by mass |

<Manufacture of Protective Film 1>

The core layer cellulose acylate dope 1 and the outer layer cellulose acylate dope 1 were filtered, using a filter paper with an average pore diameter of 34 pin and a sintered metal filter with an average pore diameter of 10 μm. Then, the core layer cellulose acylate dope 1 and the outer layer cellulose acylate dopes 1 on both sides thereof were cast simultaneously on a drum at 20° C. from a casting port in three layers, using a band casting machine.

Subsequently, the film was peeled from the drum in a state where a solvent content of the film on the drum was approximately 20% by mass. Both ends of the obtained film in the width direction were immobilized with tenter clips, and the film was dried while being stretched 1.1 times in the width direction in a state where the solvent content of the film was 3% to 15% by mass.

Then, the obtained film was transported between rolls of a heat treatment device and further dried to manufacture a cellulose acylate film 1 with a film thickness of 40 μm, which was used as a protective film 1. The results of measuring a phase difference of the protective film 1 were as follows: Re=1 nm and Rth=−5 nm.

[Manufacture of Optically Anisotropic Layer 1]

<Preparation of Composition 1 for Photo-Alignment Film>

8.4 parts by mass of the following copolymer C1 and 0.3 parts by mass of the following thermal acid generator D1 were added to a mixed liquid including 80 parts by mass and 20 parts by mass of butyl acetate and methyl ethyl ketone, respectively, to prepare a composition 1 for a photo-alignment film.

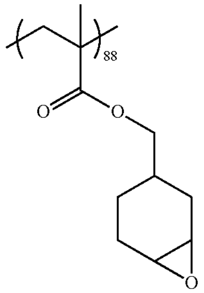

Copolymer C1 (weight-average molecular weight 40,000, the numerical value in the following formula indicates a content (% by mass) of each repeating unit)

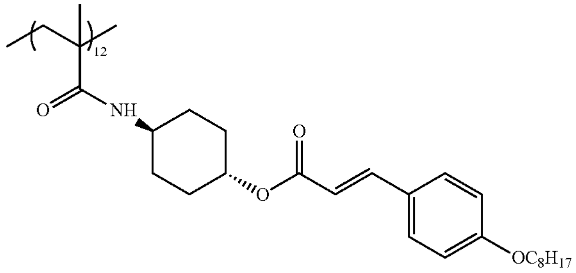

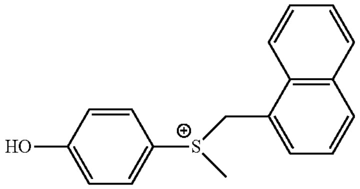

Thermal acid generator D1

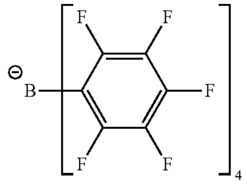

<Preparation of Polymerizable Liquid Crystal Composition 1>

A polymerizable liquid crystal composition 1 for forming an optically anisotropic layer having the following composition was prepared.

| Polymerizable Liquid Crystal Composition 1 | |
|---|---|
| The following liquid crystal compound R1 | 50.00 parts by mass |
| The following liquid crystal compound R2 | 50.00 parts by mass |
| The following monofunctional compound A1 | 12.00 parts by mass |
| The following polymerization initiator S1 | 0.50 parts by mass |
| The following leveling agent P1 | 0.23 parts by mass |
| Cyclopentanone | 202.54 parts by mass |
| Methyl ethyl ketone | 60.50 parts by mass |

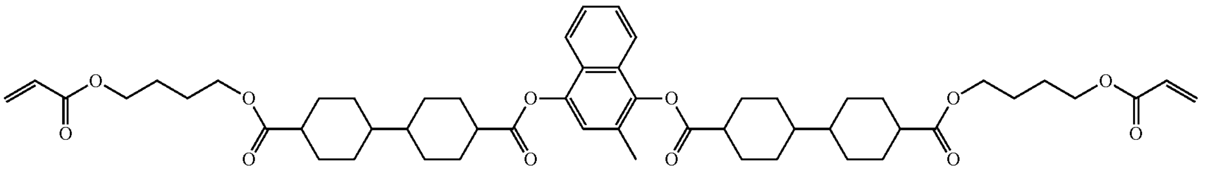

Liquid crystal compound R1 (forward wavelength dispersion liquid crystal compound A)

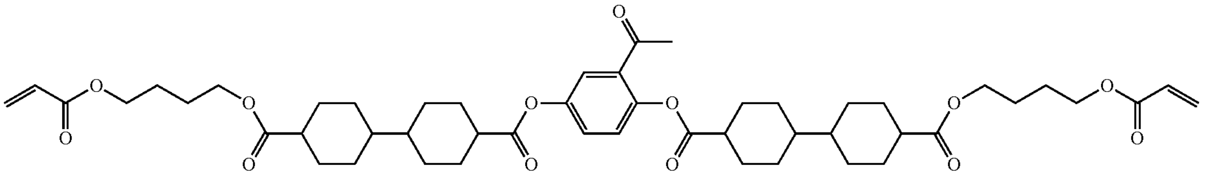

Liquid crystal compound R2 (forward wavelength dispersion liquid crystal compound B)

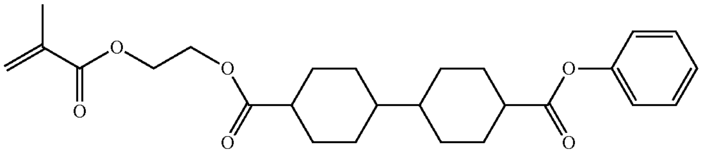

Monofunctional compound A1

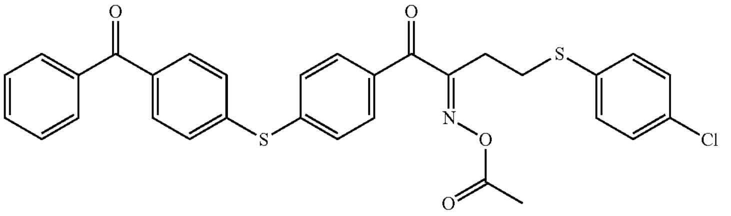

Polymerization initiator S1

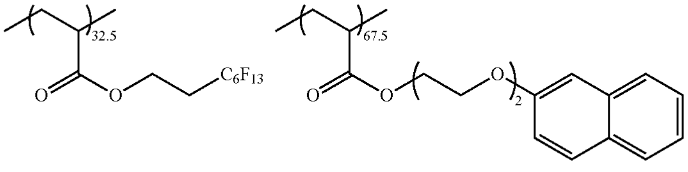

Leveling agent P1(in the following formula: 32.5 and 67.5 indicate contents (% by mass) of the respective repeating units with respect to all repeating units in the leveling agent P1)

<Manufacture of Optically Anisotropic Layer 1>

The composition 1 for the photo-alignment film prepared in advance was continuously applied onto a surface on one side of the manufactured cellulose acylate film 1 with a bar coater. After the application, the solvent was removed by drying in a heating zone at 120° C. for 1 minute to form a 0.3 μm-thick photoisomerization composition layer. Subsequently, a photo-alignment film was formed through irradiation with polarized ultraviolet rays (10 mJ/$cm^2$, using an ultra-high-pressure mercury lamp) while winding a mirror-treated backup roll.

Next, the polymerizable liquid crystal composition 1 prepared above was applied onto the photo-alignment film formed in a long shape with a die coater to manufacture a composition layer. At this time, the airflow around the die was adjusted so that the coated bead was stable. In addition, the temperature of the coating chamber was set to 23° C. The formed composition layer was heated in a heating zone to a temperature exhibiting a nematic phase, and then cooled to stabilize the alignment at a temperature exhibiting a smectic phase. Thereafter, while maintaining the temperature, the alignment was immobilized by irradiation with ultraviolet rays (500 mJ/$cm^2$, using an ultra-high-pressure mercury lamp) in a nitrogen atmosphere an oxygen concentration of 100 ppm) to form an optically anisotropic layer 1 with a thickness of 2.6 μm.

In a case where the obtained optically anisotropic layer 1 was peeled from the protective film 1 and a phase difference of the optically anisotropic layer 1 was measured, the in-plane retardation Rel(550) was 130 nm, Rel(450)/Rel (550) was 0.86, and the optically anisotropic layer 1 was confirmed to be a positive A-plate.

Examples 2 to 9

Optically anisotropic layers 2 to 9 of Examples 2 to 9 were manufactured by the same method as in Example 1, except that liquid crystal compounds shown in Table 4 below were used instead of the liquid crystal compounds R1 and R2 included in the polymerizable liquid crystal composition 1.

Example 10

An optically anisotropic layer 10 of Example 10 was manufactured by the same method as in Example 1, except that the liquid crystal compounds in Table 4 below were used instead of the liquid crystal compounds R1 and R2 included in the polymerizable liquid crystal composition 1, and the coated composition layer was heated at 120° C. for 1 minute and then cooled to 60° C. to stabilize the alignment.

Example 11

An optically anisotropic layer 11 of Example 11 was manufactured by the same method as in Example 1, except that the following polymerizable liquid crystal composition 2 was used instead of the polymerizable liquid crystal composition 1.

<Preparation of Polymerizable Liquid Crystal Composition 2>

A polymerizable liquid crystal composition 2 for forming an optically anisotropic layer having the following composition was prepared.

| Polymerizable Liquid Crystal Composition 2 | |
|---|---|
| The liquid crystal compound R1 | 17.30 parts by mass |
| The liquid crystal compound R2 | 17.30 parts by mass |
| The following liquid crystal compound R4 | 30.40 parts by mass |
| The following liquid crystal compound R5 | 20.00 parts by mass |
| The following liquid crystal compound R16 | 15.00 parts by mass |
| The monofunctional compound A1 | 15.00 parts by mass |
| The following polymerizable compound M1 | 3.00 parts by mass |
| The polymerization initiator S1 | 0.50 parts by mass |
| The following leveling agent P2 | 0.23 parts by mass |
| Cyclopentanone | 202.54 parts by mass |
| Methyl ethyl ketone | 60.50 parts by mass |

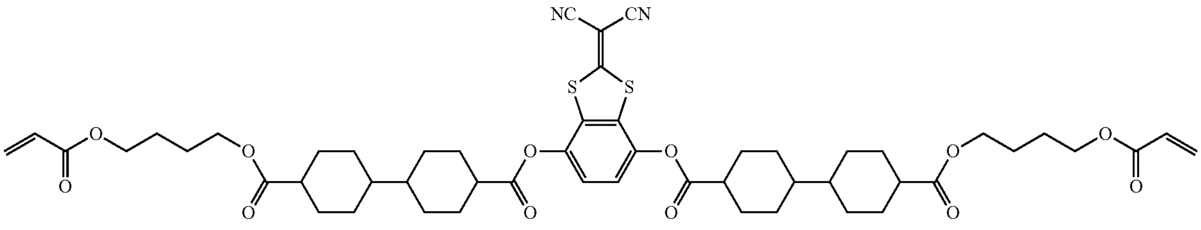

Liquid crystal compound R4

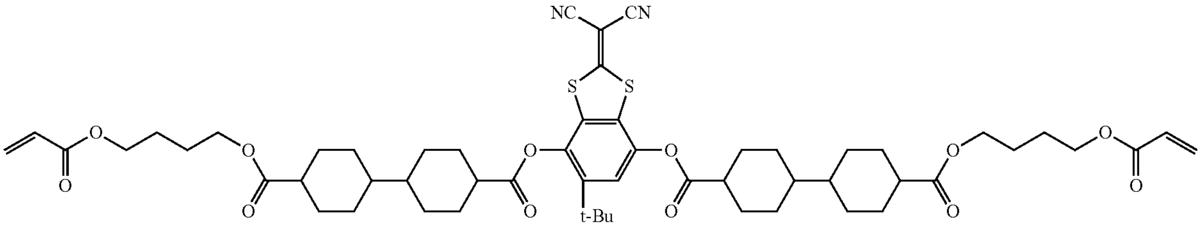

Liquid crystal compound R5

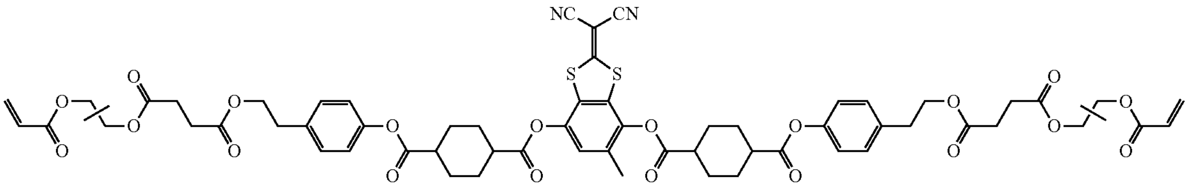

Liquid crystal compound R16

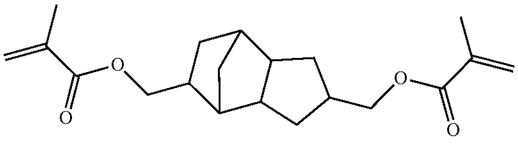

Polymerizable Compound M1

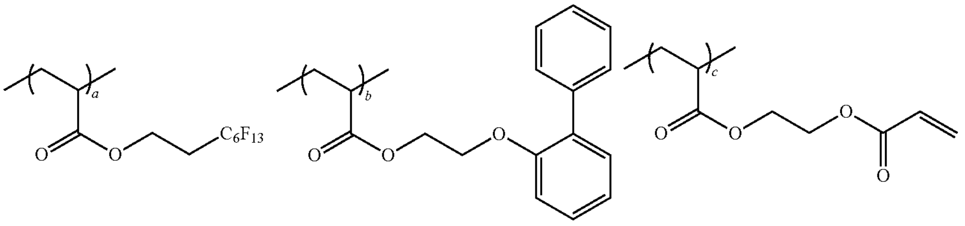

Leveling agent P2 (in the following formula: a, b, and c are a = 34.5, b = 61.0, and c = 4.5, and represent contents (% by mass) of the respective repeating untils with respect to all repeating units in the leveling agent P2)

Example 12

A optically anisotropic layer 12 of Example 12 was manufactured by the same method as in Example 11, except that the following leveling agent P3 was used instead of the leveling agent P2 included in the polymerizable liquid crystal composition 2.

Leveling agent P3 (in the following formula: a, b, and c are a=44.8, b=50.3, and c=4.9, and represent contents (% by mass) of the respective repeating units with respect to all repeating units in the leveling agent P3)

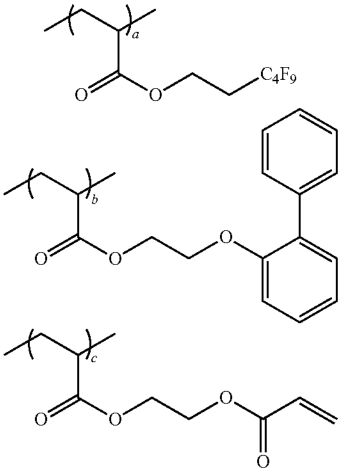

Comparative Examples 1 to 4

Optically anisotropic layers C1 to C4 of Comparative Examples 1 to 4 were manufactured by the same method as in Example 1, except that liquid crystal compounds shown in Table 4 below were used instead of the liquid crystal compounds R1 and R2 included in the polymerizable liquid crystal composition 1.

In a case where the phase difference was measured for the optically anisotropic layers 1 to 12 and C1 to C4 manufactured in Examples 1 to 12 and Comparative Examples 1 to 4, it was continued that the in-plane retardation Rel(550) was 110 to 150 nm, and the both were positive A-plates.

Evaluation

<X-Ray Diffraction Measurement>

For each of the optically anisotropic layers manufactured Examples 1 to 12 and Comparative Examples 1 to 4, X-ray diffraction measurement was performed with the following equipment under the following conditions, and it was confirmed that whether diffracted light derived from the order (periodic structure) of the smectic phase was observed and evaluated according to the following evaluation standard. The results are shown in Tables 4 to 6 below.

Furthermore, in the optically anisotropic layer 1 manufactured in Example 1, a peak showing a periodic structure was observed at 2θ=1.8°, and diffracted light derived from the order of the smectic phase was confirmed.

(Apparatus and Conditions)

X-ray diffractometer ATXG (model name, for evaluation of a thin film structure, manufactured by Rigaku), Cu source (50 kV·300 mA), 0.45 solar slit (Evaluation Standard)

A: Diffraction peaks derived from the periodic structure of the smectic phase are observed.

B: No diffraction peak derived from die periodic structure of the smectic phase is observed.

<Precipitate (Length Suitability)>

In a case where the optically anisotropic layers were manufactured in Examples 1 to 12 and Comparative Examples 1 to 4, the coated portion in a case where the polymerizable liquid crystal composition was continuously applied was Observed and evaluated according to the following evaluation standard. The results are shown in Tables 4 to 6 below. Furthermore, the streak defects are caused by the precipitates.

(Evaluation Standard)

A: Even in a case where the application is performed on 1,500 m, streak defects cannot be visible.

B. In a case where the application is performed on 1,500 m, streak defects are slightly visible, but there is no problem in practical use.

C: In a case where the application is performed on 1,500 m, streak defects are visible, but there is no problem in practical use.

D: In a case where the application is performed on 1,500 m, strong streak defects can be visible, which is a problem in practical use.

TABLE 4

| | Polymerizable liquid crystal composition | | | | | | Evaluation | |
|---|---|---|---|---|---|---|---|---|
| | Forward wavelength dispersion liquid crystal compound A | | Forward wavelength dispersion liquid crystal compound B | | Other liquid crystal compounds | | | Precipitates |
| | Type | Addition amount | Type | Addition amount | Type | Addition amount | X-rays | (length suitability) |
| Example 1 | R1 | 50 | R2 | 50 | — | — | A | A |
| Example 2 | R1 | 30 | R2 | 40 | — | — | A | A |
| | | | R3 | 30 | — | — | | |
| Example 3 | R1 | 20 | R2 | 20 | R4 | 60 | A | A |
| Example 4 | R1 | 20 | R2 | 20 | R4 | 40 | A | A |
| | | | | | R5 | 20 | | |
| Example 5 | R6 | 50 | R2 | 50 | — | — | A | A |
| Example 6 | R7 | 50 | R2 | 50 | — | — | A | B |
| Example 7 | R1 | 50 | R8 | 50 | — | — | A | C |
| Example 8 | R9 | 20 | R10 | 20 | R11 | 60 | A | A |
| Example 9 | R12 | 50 | R13 | 50 | — | — | A | B |
| Example 10 | R1 | 20 | R2 | 20 | R5 | 60 | B | C |

TABLE 4-continued

| | Polymerizable liquid crystal composition | | | | | | Evaluation | |
|---|---|---|---|---|---|---|---|---|
| | Forward wavelength dispersion liquid crystal compound A | | Forward wavelength dispersion liquid crystal compound B | | Other liquid crystal compounds | | | Precipitates |
| | Type | Addition amount | Type | Addition amount | Type | Addition amount | X-rays | (length suitability) |
| Comparative Example 1 | R14 | 100 | — | — | — | — | A | D |
| Comparative Example 2 | R14<br>R15 | 50<br>50 | — | — | — | — | A | D |
| Comparative Example 3 | — | — | R2 | 100 | — | — | A | D |
| Comparative Example 4 | — | — | R2<br>R3 | 50<br>50 | — | — | A | D |

TABLE 5

| | Polymerizable liquid crystal composition | | | | | | Evaluation | |
|---|---|---|---|---|---|---|---|---|
| | Forward wavelength dispersion liquid crystal compound A | | Forward wavelength dispersion liquid crystal compound B | | Other liquid crystal compounds | | | Precipitates |
| | Type | Addition amount | Type | Addition amount | Type | Addition amount | X-rays | (length suitability) |
| Example 11 | R1 | 17.3 | R2 | 17.3 | R4<br>R5<br>R16 | 30.4<br>20<br>15 | A | A |

TABLE 6

| | Polymerizable liquid crystal composition | | | | | | Evaluation | |
|---|---|---|---|---|---|---|---|---|
| | Forward wavelength dispersion liquid crystal compound A | | Forward wavelength dispersion liquid crystal compound B | | Other liquid crystal compounds | | | Precipitates |
| | Type | Addition amount | Type | Addition amount | Type | Addition amount | X-rays | (length suitability) |
| Example 12 | R1 | 17.3 | R2 | 17.3 | R4<br>R5<br>R16 | 30.4<br>20<br>15 | A | A |

The structures of the liquid crystal compounds in Tables 4 to 6 are shown below.

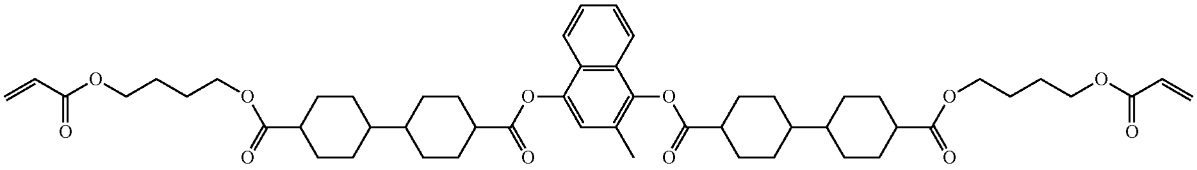

Liquid crystal compound R1

-continued
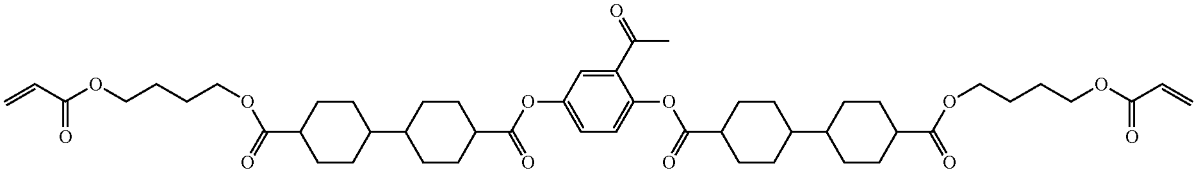
Liquid crystal compound R2
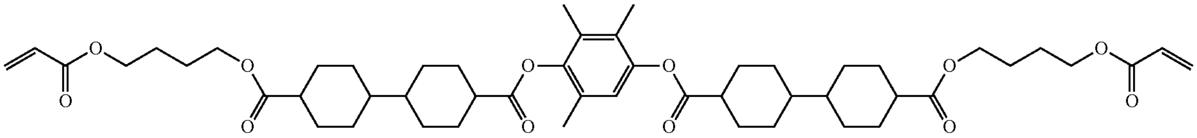
Liquid crystal compound R3
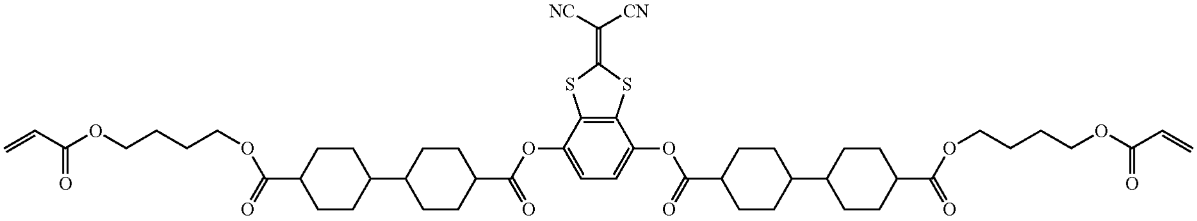
Liquid crystal compound R4
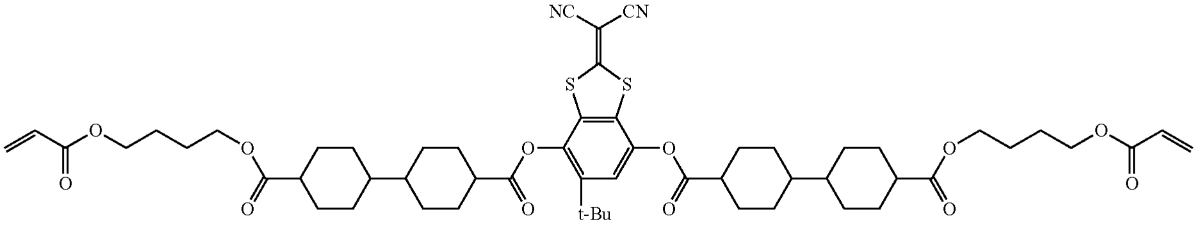
Liquid crystal compound R5
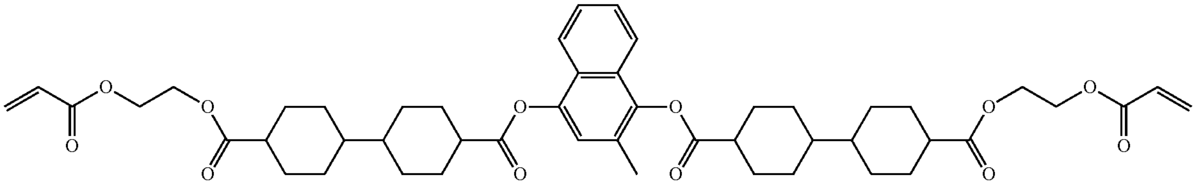
Liquid crystal compound R6
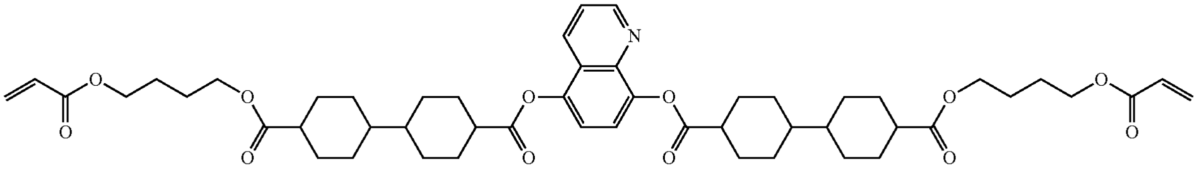
Liquid crystal compound R7
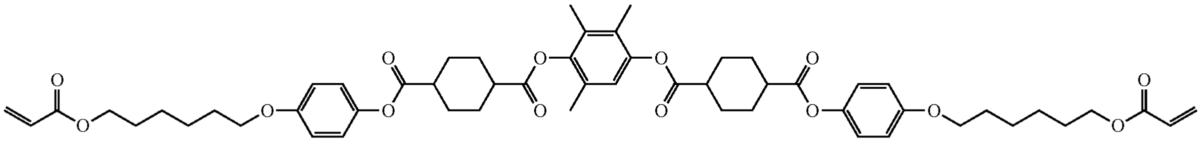
Liquid crystal compound R8
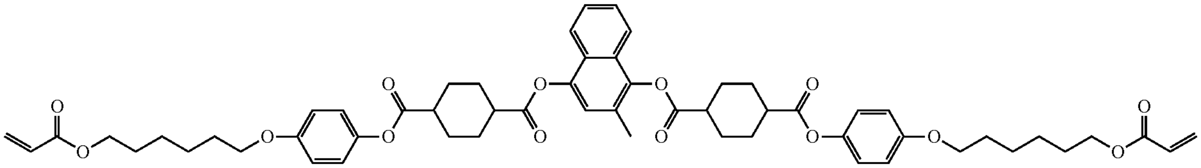
Liquid crystal compound R9

-continued
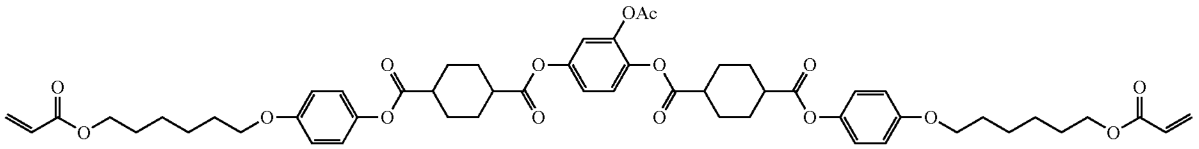
Liquid crystal compound R10
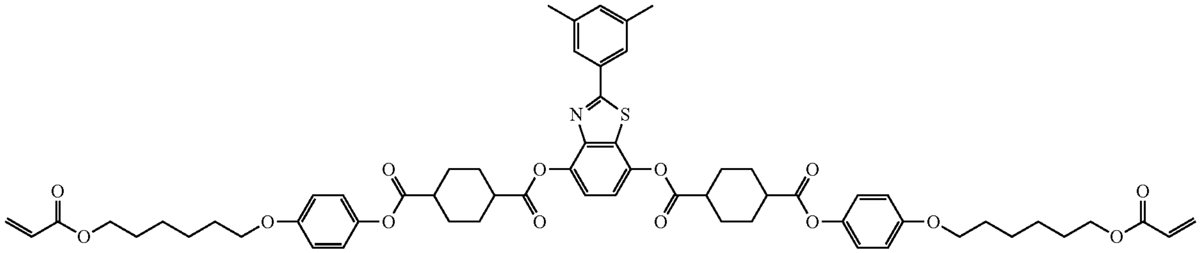
Liquid crystal compound R11
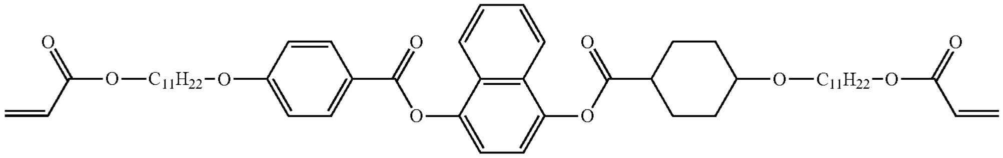
Liquid crystal compound R12
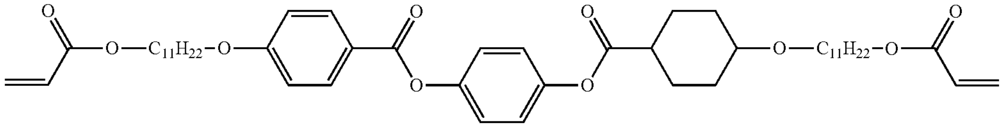
Liquid crystal compound R13
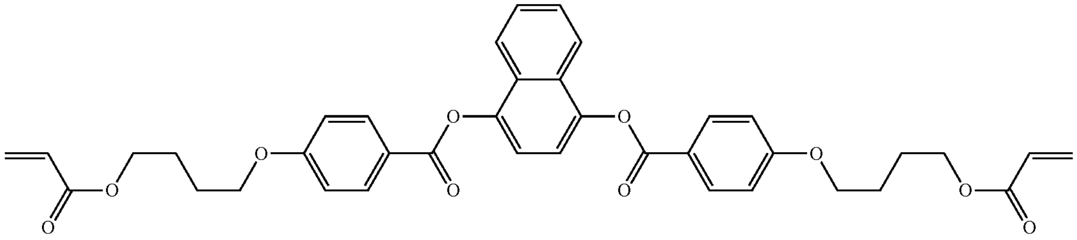
Liquid crystal compound R14
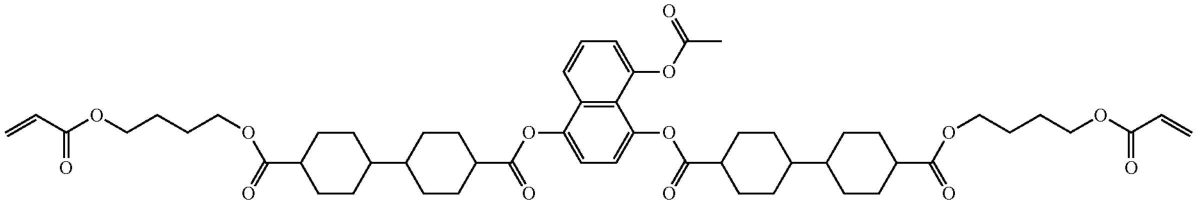
Liquid crystal compound R14
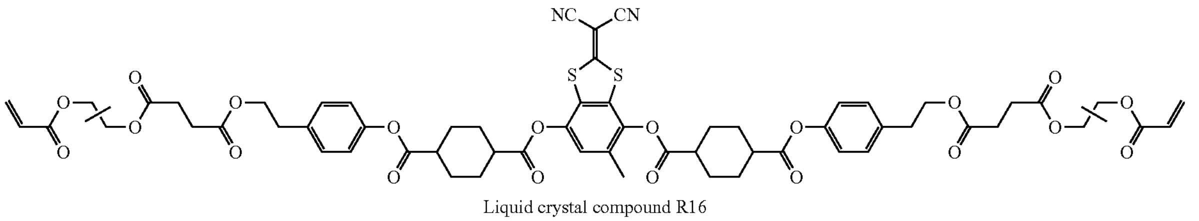
Liquid crystal compound R16

From the results shown in Table 4 above, in a case where the forward wavelength dispersion liquid crystal compound B having an aromatic ring having 6 or more and less than 10 π electrons is not blended, streak defects caused by precipitates could be confirmed even with a use of the forward wavelength dispersion liquid crystal compound A having an aromatic ring having 10 or more et electrons alone or in combination of two kinds thereof (Comparative Examples 1 and 2).

In addition, in a case where the forward wavelength dispersion liquid crystal compound A is not blended, streak defects caused by the precipitates could be confirmed even with a use of the forward wavelength dispersion liquid crystal compound B alone or in combination of two kinds thereof (Comparative Examples 1 and 2).

On the other hand, from the results shown in Tables 4 to 6 above, it was found that in a case where the forward wavelength dispersion liquid crystal compound A and the forward wavelength dispersion liquid crystal compound B are blended, the generation of precipitates can be suppressed and the length suitability is excellent (Examples 1 to 12).

In particular, from the comparison between Example 1 and Example 6, it was found that with regard to the forward wavelength dispersion liquid crystal compound A, the generation of precipitates can be further suppressed in a case where $Ar^{13}$ in Formula (I) is an aromatic hydrocarbon ring which may have a substituent.

In addition, from the comparison between Example 1 and Example 7, it was found that in a case where the array of the rings $B^{11}$ arranged in order from the polymerizable group $P^{11}$ or $P^{12}$ in the forward wavelength dispersion liquid crystal compound A is the same as the array of the rings $B^{21}$ arranged in order from the polymerizable group $P^{21}$ or $P^{22}$ in the forward wavelength dispersion liquid crystal compound B, the generation of precipitates can be further suppressed.

Moreover, from the comparison between Example 1 and Example 9, it was found that in a case where with regard to the forward wavelength dispersion liquid crystal compound A, a total of n11, m11, k11, m12, and n12 in Formula (I) is an integer of 5 to 10, and with regard to the forward wavelength dispersion liquid crystal compound B, a total of n21, m21, k21, m22, and n22 in Formula (I) is an integer of 5 to 10, the generation of precipitates can be further suppressed.

In addition, from the comparison between Example 3 and Example 10, it was found that in Example 10 which is a nematic liquid crystal system, the improvement effect by a combined use of the forward wavelength dispersion liquid crystal compound A and the forward wavelength dispersion liquid crystal compound B is low.

EXPLANATION OF REFERENCES

10: optical film
12: optically anisotropic layer
14: alignment film
16: support

What is claimed is:

1. A polymerizable liquid crystal composition comprising:

a forward wavelength dispersion liquid crystal compound A having an aromatic ring having 10 or more π electrons; and a forward wavelength dispersion liquid crystal compound B having an aromatic ring having 6 or more and less than 10 π electrons, wherein the forward wavelength dispersion liquid crystal compound A is a compound represented by Formula (I), and the forward wavelength dispersion liquid crystal compound B is a compound represented by Formula (II), $$P^{11}—Sp^{11}—(X^{11}-Ar^{11})_{n11}-(X^{12}-Cy^{11})_{m11}-(X^{13}-Ar^{13})_{k11}— —X^{14}-(Cy^{12}-X^{15})_{m12}—Ar^{12}—X^{16})_{n12}—Sp^{12}—P^{12} \quad (I)$$

$$P^{21}—Sp^{21}—(X^{21}-Ar^{21})_{n21}-(X^{22}-Cy^{21})_{m21}-(X^{23}-Ar^{23})_{k21}-X^{24}— —(Cy^{22}-X^{25})_{m22}—Ar^{22}—X^{26})_{n22}—Sp^{22}—P^{22} \quad (II)$$

in Formulae (I) and (II), $P^{11}$, $P^{12}$, $P^{21}$, and $P^{22}$ each independently represent a polymerizable group, $Sp^{11}$, $Sp^{12}$, $Sp^{21}$, and $Sp^{22}$ each independently represent a single bond, a linear alkylene group having 1 to 14 carbon atoms, a branched alkylene group having 3 to 14 carbon atoms, or a divalent linking group in which one or more of —$CH_2$-'s constituting the linear or branched alkylene group are substituted with —O—, —S—, —NH—, —N(Q)-, or —CO—, where Q represents a substituent, n11, m11, m12, n12, n21, m21, m22, and n22 each independently represent an integer of 0 to 2, provided that at least one of m11 or n11 represents 1 or 2, at least one of m12 or n12 represents 1 or 2, at least one of m21 or n21 represents 1 or 2, and at least one of m22 or n22 represents 1 or 2, k11 and k21 each independently represent 1 or 2, $X^{11}$, $X^{12}$, $X^{13}$, $X^{14}$, $X^{15}$, $X^{16}$, $X^{21}$, $X^{22}$, $X^{23}$, $X^{24}$, $X^{25}$, and $X^{26}$ each independently represent a single bond; or —CO—, —O—, —S—, —C(=S)—, —$CR^1R^2$, —$CR^3$=$CR^4$, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms, provided that in a case where n11 is 2, a plurality of $X^{11}$'s may be the same as or different from each other; in a case where m11 is 2, a plurality of $X^{12}$'s may be the same as or different from each other; in a case where k11 is 2, a plurality of $X^{13}$'s may be the same as or different from each other; in a case where m12 is 2, a plurality of $X^{15}$'s may be the same as or different from each other; in a case where n12 is 2, a plurality of $X^{16}$'s may be the same as or different from each other; in a case where n21 is 2, a plurality of $X^{21}$'s are the same as or different from each other; in a case where m21 is 2, a plurality of $X^{22}$'s may be the same as or different from each other; in a case where k21 is 2, a plurality of $X^{23}$'s are the same as or different from each other; in a case where m22 is 2, a plurality of $X^{25}$'s may be the same as or different from each other; and in a case where n22 is 2, a plurality of $X^{26}$'s may be the same as or different from each other, $Ar^{11}$, $Ar^{12}$, $Ar^{21}$, and $Ar^{22}$ each independently represent an aromatic ring which may have a substituent, provided that in a case where n11 is 2, a plurality of $Ar^{11}$'s may be the same as or different from each other; in a case where n12 is 2, a plurality of $Ar^{12}$'s may be the same as or different from each other; in a case where n21 is 2, a plurality of $Ar^{21}$'s may be the same as or different from each other; and in a case where n22 is 2, a plurality of $Ar^{22}$'s may be the same as or different from each other, $Cy^{11}$, $Cy^{12}$, $Cy^{21}$, and $Cy^{22}$ each independently represent an alicyclic ring which may have a substituent, provided that in a case where m11 is 2, a plurality of $Cy^{11}$'s may be the same as or different from each other; in a case where m12 is 2, a plurality of $Cy^{12}$'s may be the same as or different from each other; in a case where m21 is 2, a plurality of $Cy^{21}$'s may be the same as or different from each other; and in a case where m22 is 2, a plurality of $Cy^{22}$'s may be the same as or different from each other, $Ar^{13}$ represents an aromatic ring having 10 or more π electrons, which may have a substituent, provided that in a case where k11 is 2, a plurality of $Ar^{13}$'s may be the same as or different from each other, and $Ar^{23}$ represents an aromatic ring having 6 or more and less than 10 π electrons, which may have a substituent, provided that in a case where k21 is 2, a plurality of $Ar^{23}$'s may be the same as or different from each other, wherein in Formula (I), a total of n11, m11, k11, m12, and n12 is an integer of 5 to 10, and in Formula (II), a total of n21, m21, k21, m22, and n22 is an integer of 5 to 10.

2. The polymerizable liquid crystal composition according to claim 1, wherein in Formula (I), m11 is 2, $X^{12}$ existing between two $Cy^{11}$'s is a single bond, m12 is 2, and $X^{15}$ existing between two $Cy^{12}$'s is a single bond, and in Formula (II), m21 is 2, $X^{22}$ existing between two $Cy^{21}$'s is a single bond, m22 is 2, and $X^{25}$ existing between two $Cy^{22}$'s is a single bond.

3. The polymerizable liquid crystal composition according to claim 1, wherein the compound of Formula (I) and the compound of Formula (II) are essentially the same compound except for the respective substituent $Ar^{13}$ and $Ar^{23}$.

4. The polymerizable liquid crystal composition according to claim 1, wherein $Ar^{13}$ in Formula (I) and $Ar^{23}$ in Formula (II) are both aromatic hydrocarbon rings which may have a substituent.

5. The polymerizable liquid crystal composition according to claim 1, wherein $Ar^{13}$ in Formula (I) is an aromatic ring represented by Formula (III), (III)

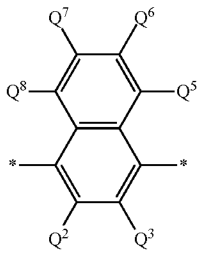

in Formula (III),

* represents a bonding position to $X^{13}$ or $X^{14}$, and $Q^2$, $Q^3$, $Q^5$, $Q^6$, $Q^7$, and $Q^8$ each independently represent a hydrogen atom or a substituent.

6. The polymerizable liquid crystal composition according to claim 1, further comprising a reverse wavelength dispersion liquid crystal compound represented by Formula (V), $$P^{51}—Sp^{51}—(X^{51}—Ar^{51})_{n51}—(X^{52}—Cy^{51})_{m51}—(X^{53}—Ar^{53})_{k51}—X^{54}—(Cy^{52}—X^{55})_{m52}—Ar^{52}—X^{56})_{n52}—Sp^{52}—P^{52} \quad (V)$$

in Formulae (V), $P^{51}$ and $P^{52}$ each independently represent a polymerizable group, $Sp^{51}$ and $Sp^{52}$ each independently represent a single bond, a linear alkylene group having 1 to 14 carbon atoms, a branched alkylene group having 3 to 14 carbon atoms, or a divalent linking group in which one or more of —$CH_2$-'s constituting the linear or branched alkylene group are substituted with —O—, —S—, —NH—, —N(Q)-, or —CO—, where Q represents a substituent, n51, m51, m52, and n52 each independently represent an integer of 0 to 2, provided that at least one of m51 or n51 represents 1 or 2, and at least one of m52 or n52 represents 1 or 2, k51 represents 1 or 2, $X^{51}$, $X^{52}$, $X^{53}$, $X^{54}$, $X^{55}$, and $X^{56}$ each independently represent a single bond; or —CO—, —O—, —S—, —C(=S)—, —$CR^1R^2$—, —$CR^3$—$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms, provided that in a case where n51 is 2, a plurality of $X^{51}$'s may be the same as or different from each other; in a case where m51 is 2, a plurality of $X^{52}$'s may be the same as or different from each other; in a case where k51 is 2, a plurality of $X^{53}$'s may be the same as or different from each other; in a case where m52 is 2, a plurality of $X^{55}$'s may be the same as or different from each other; and in a case where n52 is 2, a plurality of $X^{56}$'s may be the same as or different from each other, $Ar^{51}$ and $Ar^{52}$ each independently represent an aromatic ring which may have a substituent, provided that in a case where n51 is 2, a plurality of $Ar^{51}$'s may be the same as or different from each other; and in a case where n52 is 2, a plurality of $Ar^{52}$'s may be the same as or different from each other, $Cy^{51}$ and $Cy^{52}$ each independently represent an alicyclic ring which may have a substituent, provided that in a case where m51 is 2, a plurality of $Cy^{51}$'s may be the same as or different from each other; and in a case where m52 is 2, a plurality of $Cy^{52}$'s may be the same as or different from each other, $Ar^{53}$ represents any of aromatic rings selected from the group consisting of the above-mentioned groups represented by Formulae (Ar-1) to (Ar-7), (Ar-1)

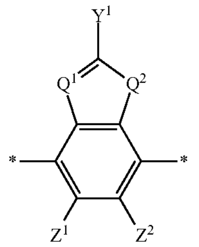

(Ar-2)

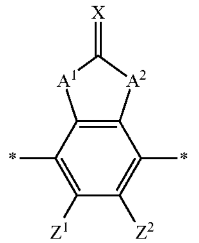

(Ar-3)

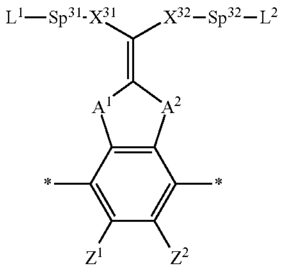

(Ar-4)

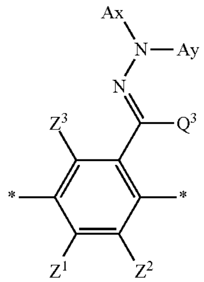

(Ar-5)

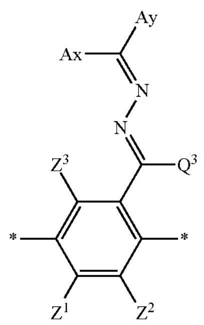

-continued (Ar-6)

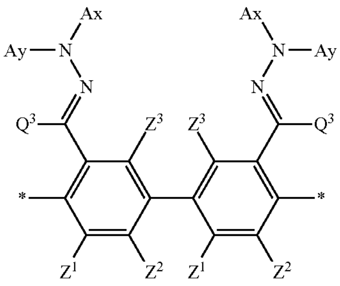

(Ar-7)

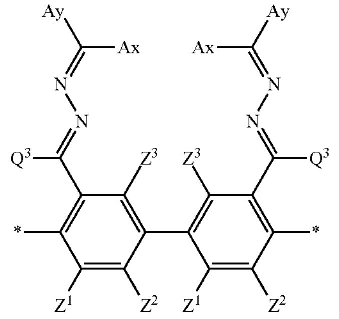

in Formulae (Ar-1) to (Ar-7), in a case where k5 represents 1, one of two * represents a bonding position to $X^{53}$, and the other represents a bonding position to $X^{54}$; in a case where k5 represents 2 and $Ar^{53}$ exists between two $X^{53}$s, two * represent a bonding position to $X^{53}$, respectively; in a case where k5 represents 2 and $Ar^{53}$ exists between $X^{53}$ and $X^{54}$, one of two * represents a bonding position to $X^{53}$, and the other represents a bonding position to $X^{54}$, $Q^1$ represents N or CH, $Q^2$ represents —S—, —O—, or —N($R^6$)—, where $R^6$ represents a hydrogen atom or an alkyl group having 1 to 6 carbon atoms, $Y^1$ represents an aromatic hydrocarbon group having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, and one or more of —$CH_2$-'s constituting the alicyclic hydrocarbon group may be substituted with —O—, —S—, or —NH—, $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 6 to 20 carbon atoms, a halogen atom, a cyano group, a nitro group, —$OR^7$, —$NR^8R^9$, —$SR^{10}$, —$COOR^{11}$, or —$COR^{12}$, $R^7$ to $R^{12}$ each independently represent a hydrogen atom or an alkyl group having 1 to 6 carbon atoms, and $Z^1$ and $Z^2$ may be bonded to each other to form an aromatic ring, $A^1$ and $A^2$ each independently represent a group selected from the group consisting of —O—, —N($R^{13}$)—, —S—, and —CO—, where $R^{13}$ represents a hydrogen atom or a substituent, X represents a non-metal atom of Groups XIV to XVI to which a hydrogen atom or a substituent may be bonded, $X^{31}$ and $X^{32}$ each independently represent a single bond; or —CO—, —O—, —S—, —C(=S)—, —$CR^1R^2$—, —$CR^3$=$CR^4$, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms, $Sp^{31}$ and $Sp^{32}$ each independently represent a single bond, a linear alkylene group having 1 to 14 carbon atoms, a branched alkylene group having 3 to 14 carbon atoms, or a divalent linking group in which one or more of —$CH_2$-'s constituting the linear or branched alkylene group are substituted with —O—, —S—, —NH—, —N(Q)-, or —CO—, where Q represents a substituent, $L^1$ and $L^2$ each independently represent a monovalent organic group, and at least one of $L^1$ or $L^2$ represents a polymerizable group, Ax represents at least one aromatic ring selected from the group consisting of an aromatic hydrocarbon ring and an aromatic heterocyclic ring, Ay represents a hydrogen atom, an alkyl group which may have a substituent, or at least one aromatic ring selected from the group consisting of an aromatic hydrocarbon ring and an aromatic heterocyclic ring, the aromatic ring in each of Ax and Ay may have a substituent, and Ax and Ay may be bonded to each other to form a ring, and $Q^3$ represents a hydrogen atom or an alkyl group having 1 to 20 carbon atoms, which may have a substituent.

7. An optically anisotropic layer obtained by immobilizing an alignment state of the polymerizable liquid crystal composition according to claim 1.

8. The optically anisotropic layer according to claim 7, wherein the optically anisotropic layer exhibits a smectic phase.

9. The optically anisotropic layer according to claim 8, wherein the optically anisotropic layer has one surface and another surface, and wherein the forward wavelength dispersion liquid crystal compound A and the forward wavelength dispersion liquid crystal compound B included in the polymerizable liquid crystal composition are in a state of being horizontal alignment with respect to the one surface of the optically anisotropic layer.

10. The optically anisotropic layer according to claim 8, wherein the optically anisotropic layer is a positive A-plate.

11. An optical film comprising the optically anisotropic layer according to claim 7.

12. The optical film according to claim 11, wherein the optically anisotropic layer is formed on a surface of a photo-alignment film.

13. A polarizing plate comprising:

the optical film according to claim 11; and a polarizer.

14. An image display device comprising the optical film according to claim 11.

15. The image display device according to claim 14, wherein the image display device is a liquid crystal display device.

16. The image display device according to claim 14, wherein the image display device is an organic EL display device.

* * * * *